US012588501B2

(12) United States Patent
Bodiley et al.

(10) Patent No.: US 12,588,501 B2
(45) Date of Patent: Mar. 24, 2026

(54) HEATSINK FOR A MEMORY AND ROUTING MODULE

(71) Applicant: Graphcore Limited, Bristol (GB)

(72) Inventors: Stephen Bodiley, Bristol (GB); David Japp, Bristol (GB); Stephen Felix, Bristol (GB)

(73) Assignee: GRAPHCORE LIMITED, Bristol (GB)

( * ) Notice: Subject to any disclaimer, the term of this patent is extended or adjusted under 35 U.S.C. 154(b) by 478 days.

(21) Appl. No.: 18/174,997

(22) Filed: Feb. 27, 2023

(65) Prior Publication Data

US 2023/0282539 A1 Sep. 7, 2023

(30) Foreign Application Priority Data

Mar. 1, 2022 (GB) ..................................... 2202826

(51) Int. Cl.
| | |
|---|---|
| *H01L 23/367* | (2006.01) |
| *G06F 1/20* | (2006.01) |
| *H01L 23/40* | (2006.01) |
| *H01L 23/46* | (2006.01) |
| *H01L 25/065* | (2023.01) |

(52) U.S. Cl.
CPC .............. *H01L 23/367* (2013.01); *G06F 1/20* (2013.01); *H01L 23/40* (2013.01); *H01L 23/46* (2013.01); *H01L 25/0655* (2013.01)

(58) Field of Classification Search
CPC .............. H01L 23/3107; H01L 23/367; H01L 23/3672; H01L 23/3675; H01L 23/3677;
H01L 23/40; H01L 23/4006; H01L 23/4338; H01L 23/46; H01L 23/49575; H01L 21/4882; H01L 25/0655;
(Continued)

(56) References Cited

U.S. PATENT DOCUMENTS

| | | | |
|---|---|---|---|
| 6,549,410 B1 * | 4/2003 | Cohen ................ | H01L 23/4006 |
| | | | 361/801 |
| 10,304,755 B1 * | 5/2019 | Yatskov .............. | H01L 23/4006 |

(Continued)

OTHER PUBLICATIONS

Search Report dated Dec. 21, 2022 for United Kingdom Patent Application No. GB2202826.0 3 pages.

*Primary Examiner* — Amir A Jalali
(74) *Attorney, Agent, or Firm* — HAYNES AND BOONE, LLP

(57) ABSTRACT

A heatsink is provided for a memory and routing module with a lower and upper side, both sides having multiple semiconductor chips attached. The lower side of the module has a connection component attached for connection to a motherboard. The heatsink includes a module receiving region configured to receive a lower side of the module, including a first thermally conductive portion arranged to face the semiconductor chips, an aperture through the lower heatsink component and a thermally conductive peripheral region disposed around the module receiving region. The heatsink includes an upper heatsink component which is configured to connect to the lower heatsink component at the peripheral region to retain the module. The upper heatsink component includes a lower side. The lower side includes a second thermally conductive portion arranged to face the semiconductor chips disposed on an upper side of the module and multiple second heat dissipating elements.

19 Claims, 19 Drawing Sheets

(58) Field of Classification Search
CPC ....... H01L 2023/405; H01L 2023/4056; H01L
2023/4062; H01L 2023/4081; H01L
2023/4087; H01L 2224/32245; H01L
2224/33181; G06F 1/20; H05K 1/0203;
H05K 1/0204; H05K 1/116; H05K 1/182;
H05K 7/20127; H05K 7/2039; H05K
7/20418; H05K 7/2049; H05K 7/20509;
H05K 2201/066; H05K 2201/10159;
H05K 2201/10409
See application file for complete search history.

(56) References Cited

U.S. PATENT DOCUMENTS

| 10,616,993 | B1 * | 4/2020 | Gawlowski | .......... H05K 1/0203 |
| 10,802,536 | B2 | 10/2020 | Knowles | |
| 10,936,008 | B2 | 3/2021 | Knowles | |
| 10,978,372 | B1 * | 4/2021 | Tong | ....................... H01L 23/40 |
| 11,109,515 | B1 | 8/2021 | Nagarajan | |
| 11,321,272 | B2 | 5/2022 | Knowles | |
| 2006/0146500 | A1 * | 7/2006 | Yatskov | ................ H01L 23/427 |
| | | | | 257/E23.099 |
| 2009/0083972 | A1 * | 4/2009 | Colbert | ............... H01L 23/4006 |
| | | | | 29/726 |
| 2011/0286179 | A1 | 11/2011 | Motschman | |
| 2016/0278198 | A1 * | 9/2016 | Matsumoto | ............. H01L 23/36 |
| 2018/0321715 | A1 * | 11/2018 | Gopalakrishna | .......... G06F 1/20 |
| 2019/0200479 | A1 * | 6/2019 | Yatskov | .............. H01L 23/3672 |
| 2023/0420338 | A1 * | 12/2023 | Subrahmanyam | ........................... |
| | | | | H01L 23/3672 |
| 2024/0121881 | A1 * | 4/2024 | Chen | .................... H05K 1/0203 |

* cited by examiner

HEATSINK FOR A MEMORY AND ROUTING MODULE

CROSS-REFERENCE TO RELATED APPLICATIONS

The present application claims priority to United Kingdom Patent Application No. GB2202826.0 filed Mar. 1, 2022, the disclosure of which is hereby incorporated herein by reference in its entirety.

FIELD

The present disclosure relates to a heatsink. The present disclosure also relates to an assembly comprising the heatsink and a memory and routing module.

BACKGROUND

The demand for high performance computing is ever increasing. In particular, efforts are being made to meet the demands of artificial intelligence/machine learning models which impose strenuous requirements on computing resource. It is known to address certain requirements by interconnecting a plurality of processing chips in a cluster, the processing chips being configured to operate in a co-operative manner to meet the demands of processing power required to process large AI/ML models.

Another demand which is imposed on high performance compute is the ability to have access to high-capacity memory. Attempts have been made to connect external memory to processing nodes in a cluster to increase the capacity of the memory. Such external memory may be connected by external links which provide an access path between the external memory and the processing node. For example, dynamic random access memories (DRAMs) may be mounted on dual in-line memory modules (DIMMs) on server racks. These can provide the scalable memory capacity of the order of terabytes. The provision of large amounts of external memory also presents challenges in effectively cooling the memory.

It is an aim of the disclosure to address the difficulties discussed above, and any other difficulties that would be apparent to the skilled reader from the description herein.

SUMMARY

The present inventor seeks to address the above problems by providing a heatsink for a module having high-capacity memory that is readily accessible to a cluster of processing chips and allows the processing chips to communicate with one another.

According to an aspect of the disclosure, there is provided a heatsink for a memory and routing module, the memory and routing module having a lower side and an upper side, each side having a plurality of semiconductor chips attached thereto, the lower side further having a connection component attached thereto, the memory and routing module for electrical connection to a motherboard, the heatsink comprising:

a lower heatsink component comprising:

a module receiving region configured to receive a lower side of the memory and routing module and comprising:

a first thermally conductive portion arranged to face the plurality of semiconductor chips disposed on the lower side of the memory and routing module;

an aperture through the lower heatsink component configured to permit the connection component disposed on the lower side of the memory and routing module to connect to a corresponding connection component disposed on the motherboard;

a thermally conductive peripheral region disposed around the module receiving region, the peripheral region connected to the first thermally conductive portion and comprising a plurality of first heat dissipating elements configured to dissipate heat conducted from the plurality of semiconductor chips disposed on the lower side of the memory and routing module;

an upper heatsink component, the upper heatsink component configured to connect to the lower heatsink component at the peripheral region so as to retain the memory and routing module between the upper heatsink component and lower heatsink component, the upper heatsink component comprising:

a lower side comprising a second thermally conductive portion arranged to face the plurality of semiconductor chips disposed on an upper side of the memory and routing module;

a plurality of second heat dissipating elements connected to the second thermally conductive portion and configured to dissipate heat conducted from the one or semiconductor chips disposed on the lower side of the memory and routing module.

The lower heatsink component may comprise two apertures therethrough to permit two connection components to connect to corresponding connection components on the motherboard. The first thermally conductive portion may be arranged between the two apertures to face the plurality of semiconductor chips disposed on the lower side of the memory and routing module between the two connection components.

The first thermally conductive portion may comprise thermal interface material to provide conformant thermal conduction across the plurality of semiconductor chips disposed on the lower side of the memory and routing module.

The second thermally conductive portion may comprise thermal interface material to provide conformant thermal conduction across the plurality of semiconductor chips disposed on the upper side of the memory and routing module The module receiving region may comprise a recess corresponding in size to a substrate of the memory and routing module.

The first and/or second heat dissipating elements may comprise fins. The fins may be rectangular, circular, square or any suitable shape.

The upper heatsink component and lower heatsink component may be configured to the memory and routing module. The upper heatsink component and lower heatsink component may be configured to clamp a substrate of the memory and routing module, suitably around a peripheral edge thereof.

The heatsink may comprise a plurality of lugs extending from the upper heatsink component. The heatsink may comprise a plurality of bores formed in the peripheral region of the lower heatsink component. The heatsink may comprise a plurality of connecting fasteners configured to extend through the lugs and into the bores to connect the upper heatsink component to the lower heatsink component. The lugs may be configured to deform towards the lower heatsink during connection.

The lower and/or upper heatsink component may be formed of or comprise aluminum. The lower and/or heatsink may be formed of or comprise a thermally conductive material such as copper or graphene.

The heatsink may be a passive heatsink. The passive heatsink may comprise a plurality of heat dissipating fins.

The heatsink may comprise a fastener receivable in a fastener receiving section of the motherboard. The fastener may be configured for a first phase of attachment in which the fastener is extended into the fastener receiving section without drawing the heatsink towards the motherboard. The fastener may be further configured for a second phase of attachment in which the fastener draws the heatsink towards the motherboard.

The fastener may comprise an unthreaded body portion retained in a channel formed in the heatsink. The unthreaded body portion may be longer than the channel. The fastener may comprise a threaded portion configured to be received in a threaded bore of the fastener receiving section. The unthreaded body portion may be configured to travel through the channel in the first phase of attachment.

The heatsink may comprise a first fastener disposed at one side of the heatsink and a second fastener disposed at an opposing side of the heatsink. The first and/or second fasteners may be disposed in a middle of their respective sides of the heatsink. Each respective side may be substantially parallel with a long edge of a respective connection component.

According to another aspect of the disclosure, there is provided an assembly comprising the heatsink defined herein and a memory and routing module retained in the heatsink.

According to another aspect of the disclosure, there is provided a system comprising the assembly defined herein and a motherboard to which the assembly is attachable via the corresponding connection component. The system may further comprise a processor disposed on the motherboard.

According to another aspect of the disclosure, there is provided a method of assembling a memory and routing module and a heatsink, comprising:

placing the module in a module receiving region of a lower heatsink component, so that a thermally conductive portion of the lower heat sink component faces a plurality of semiconductor chips disposed on a lower side of the memory and routing module; and connecting an upper heatsink component to the lower heatsink component to retain the memory and routing module between the upper heatsink component and lower heatsink component.

Further optional features of the assembly, system and method are as defined above in relation to the heatsink and may be combined in any combination.

According to another aspect of the disclosure, there is provided a mounting component comprising:

a module receiving region configured to receive a memory and routing module, an aperture through the mounting component to permit a first connection component disposed on the memory and routing module to connect to a second connection component disposed on a motherboard; and a fastener receivable in a fastener receiving section of the motherboard;

wherein the fastener is configured for:

a first phase of attachment in which the fastener is extended into the fastener receiving section without drawing the mounting component towards the motherboard; and a second phase of attachment in which the fastener draws the mounting component towards the motherboard.

The fastener may comprise an unthreaded body portion retained in a channel formed in the mounting component. The unthreaded body portion may be longer than the channel. The fastener may comprise a threaded portion configured to be received in a threaded bore of the fastener receiving section. The fastener may be configured to descend through the channel in the first phase of attachment.

The mounting component may comprise a first fastener disposed at one side of the heatsink and a second fastener disposed at an opposing side of the heatsink.

Further optional features of the mounting component are as defined herein in relation to the heatsink and may be combined in any combination.

According to another aspect of the disclosure, there is provided an example method of mounting a memory and routing module to a motherboard, comprising: placing the module in a module receiving region of a mounting component; extending a fastener of the mounting component into a fastener receiving section of the motherboard without drawing the mounting component toward the motherboard; and extending the fastener into the fastener receiving section to draw the mounting component towards the motherboard.

BRIEF DESCRIPTION OF THE DRAWINGS

For a better understanding of the present disclosure and to show how the same may be carried into effect, reference will now be made by way of example only to the accompanying drawings.

FIG. 3b is a lower perspective view of the example memory and routing module of FIG. 3a.

Figure 1:
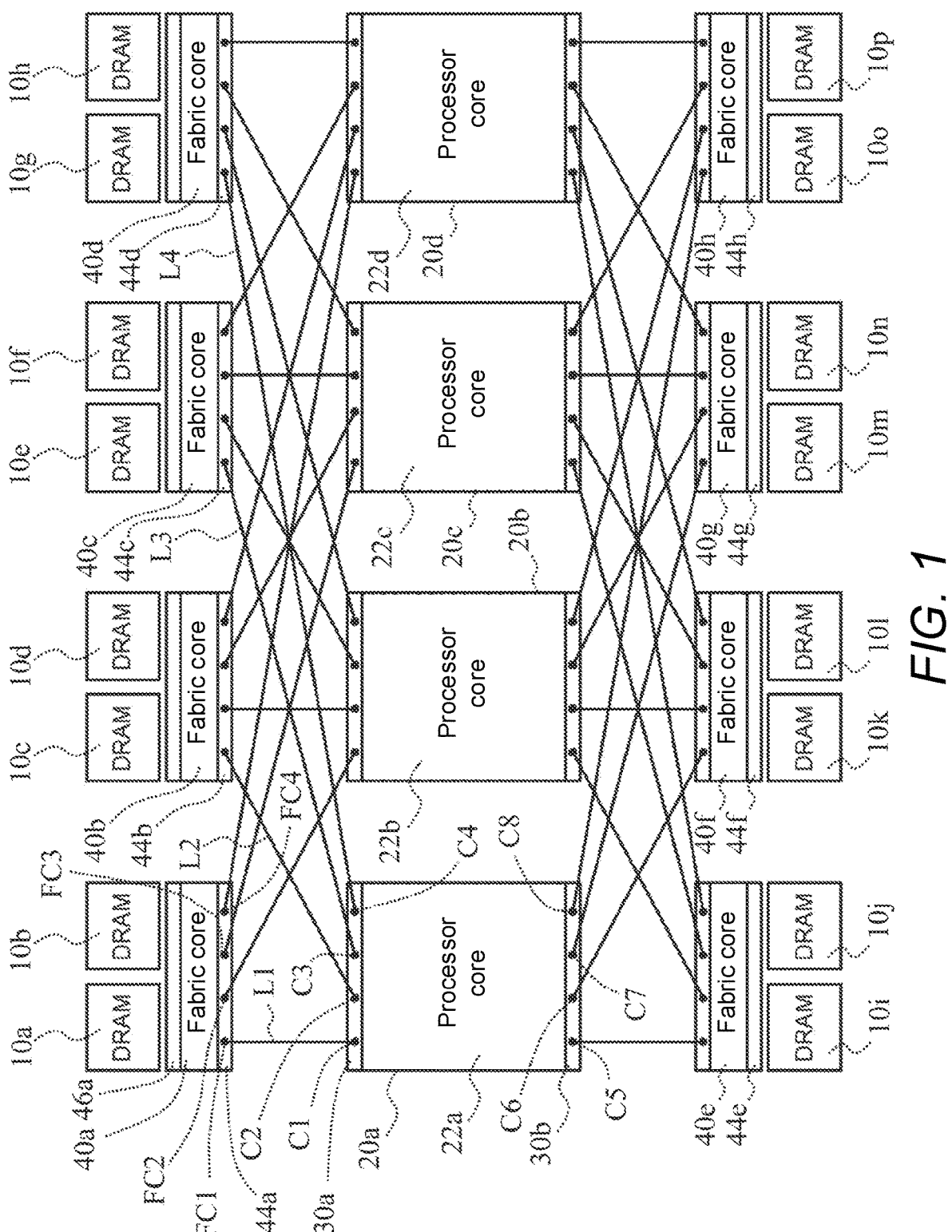
FIG. 1 is a schematic diagram of a computing system.

In the drawings, corresponding reference characters indicate corresponding components. The skilled person will appreciate that elements in the figures are illustrated for simplicity and clarity and have not necessarily been drawn to scale. For example, the dimensions of some of the elements in the figures may be exaggerated relative to other elements to help to improve understanding of various example embodiments. Also, common but well-understood elements that are useful or necessary in a commercially feasible embodiment are often not depicted in order to facilitate a less obstructed view of these various example embodiments.

DETAILED DESCRIPTION OF EXAMPLES

In certain examples of the present disclosure, a computer comprises a plurality of processor chips and fabric chips, arranged in clusters. Within a cluster, each processor chip is connected to all of the fabric chips, and each fabric chip is connected to all of the processor chips in an all-to-all bipartite connected configuration. There are no direct connections between the fabric chips themselves in a cluster. Further, there are no direct connections between the processor chips themselves. Each fabric chip has routing logic which is configured to route incoming packets from one processor chip to another processor chip which is connected to the fabric chip. Furthermore, each fabric chip has means for attaching to external memory. The routing logic is capable of routing packets between a processor connected to the fabric chip and memory which is attached to the fabric chip. The fabric chip itself comprises a memory controller which performs memory control functions for governing memory accesses from and to memory attached to the fabric chip.

In certain embodiments, further described herein, clusters of processing chips and fabric chips may themselves be interconnected to form a larger computer system. Each processor chip within a cluster may access any of the memory attached to any of the fabric chips within the cluster. This significantly enhances the memory capacity which is rendered available to any particular processor chip.

The connection configuration described herein has the further merit that in certain embodiments, it is not necessary to use all of the edges of a processor die for surfacing external connections.

In accordance with the presently described example of the disclosure, multiple processors (also referred to herein as processor chips) are connected in a cluster using one or more "fabric chips". Each fabric chip provides access to external memory (e.g. DRAM) and also provides routing of inter-processor traffic. Reference is made to FIG. 1. FIG. 1 illustrates four processor chips 20a, 20b, 20c, 20d. Each processor chip comprises a processor core area 22a, 22b, 22c, 22d which extends to each longitudinal edge of the chip. Each processor chip has an upper beachfront area 30a and a lower beachfront area 30b (shown for chip 20a only). The upper beachfront area 30a has a set of external port connections C1, C2, C3, C4 (labelled only on processor chip 20a). It will be evident that each processor chip also has four external port connections on the upper beach front area. The lower beachfront area of each processor chip similarly has four external port connections labelled C5, C6, C7, C8. Note that the lower set of external port connections is a labelled only on the processor chip 20a. It is evident that the other processor chips similarly each have a set of external port connections on their lower beachfront areas.

The cluster of FIG. 1 further comprises eight "fabric chips", which may also be referred to herein as "memory and routing chips" or "routing chips". Each fabric chip comprises a fabric core 40a, 40b . . . 40h. Each fabric chip has a lower beachfront area 44a . . . 44h which has a set of external ports. These external ports are provided in port connections labelled on fabric chip 40a only as FC1, FC2, FC3, FC4. It is apparent that each fabric chip has a corresponding set of external ports on each lower beachfront area. The upper beachfront area of each fabric chip is provided with one or more memory attachment interface which enables the fabric chip to connect to one or more memory, illustrated in FIG. 1 as respective DRAMs 10a, 10b, 10c, 10d . . . to 10p. For example, the fabric core 40a shown in FIG. 1 is connected to two DRAMS 10a, 10 by suitable memory attachment interfaces provided on the upper beachfront 46a of the fabric chip. Other high capacity memories may be connected, for example Double Data Rate DRAMs (DDRs) and later manifestations thereof such as Low Power DDRs (LPDDRs). The high bandwidth connectivity between processor chips and fabric chips within a cluster is "all-to-all bipartite". This means that each processor chip is connected to every fabric chip, and each fabric chip is connected to every processor chip. Connections are via links such as L1 between a processor port in a port connection, such as C1, and a fabric chip port in a port connection, such as FC1. Note, however, that in the example shown there are no direct high bandwidth connections between processor chips, or between fabric chips within the cluster. Moreover, in the example shown, there is no externally attached memory directly connected to each processor (although there may be High Bandwidth Memory within a chip package). Each fabric chip provides a routing function which provides pathways between every pair of processors, and between each processor and the memory attached to the fabric chip.

Furthermore, the links could be manifest in any suitable way. Each link can be connected or reconnected to different ports to set up a computer configuration. Once a computer configuration has been set up and is in operation, the links are not multiplexable and do not fan in or fan out. That is, there are no intermediate switches instead a port on a processor is directly connected to an end port on the fabric chip. Any packet transmitted over a link will be received at the port at the other end of the fixed link. It is advantageous that the links are bi-directional and preferable that they can operate in both directions at once, although this is not an essential requirement. One particular category of communication link is a SERDES link which has a power requirement which is independent of the amount of data that is carried over the link, or the time spent carrying that data. SERDES is an acronym for Serializer/DeSerializer and such links are known. For example, a twisted pair of wires may be used to implement a SERDES link. In order to transmit a signal on a wire of such links, power is required to be applied to the wire to change the voltage in order to generate the signal. A SERDES link has the characteristic that there is a fixed power for a bandwidth capacity on a SERDES link whether it is used or not. This is due to the need to provide clocking information on the link by constantly switching the current or voltage state of the wire(s) even when no data is being transmitted. As is known, data is transmitted by holding the state of the wire(s) to indicate a logic '0' or logic '1'. A SERDES link is implemented at each end by circuitry which connects a link layer device to a physical link such as copper wires. This circuitry is sometimes referred to as PHY (physical layer). In the present example, packets are transmitted over the links using Layer 1 and Layer 2 of an Ethernet protocol. However, it will be appreciated that any data transmission protocols could be used.

There are several advantages to the computer described herein.

It is no longer necessary to dedicate a fixed proportion of processor beachfront (and therefore IO bandwidth) to fixed capacity memory or to inter-processor connectivity. All processor IO bandwidth passes via the fabric chips, where it can be used on-demand for either purpose (memory or inter-processor).

Under some popular models of multiprocessor computation, such as bulk synchronous parallel (BSP), the usage of peak DRAM bandwidth and peak inter-processor bandwidth might not be simultaneous. The total bandwidth requirement may therefore be satisfied with less processor beachfront, providing the processor chips with more core area. BSP in itself is known in the art. According to BSP, each processing node performs a compute phase and an exchange phase (sometimes called communication or message passing phase) in an alternating cycle. The compute phase and exchange phase are performed by the processing chips executing instructions. During the compute phase, each processing unit performs one or more computation tasks locally, but does not communicate any results of these computations to the other processing chips in the cluster. In the exchange phase, each processing chip is allowed to exchange one or more results of the processing from the preceding compute phase to and/from one or more others of the processing chips in the cluster. Note that different processing chips may be assigned to different groups for synchronisation purposes. According to the BSP principle, a barrier synchronisation is placed at the juncture transitioning from the compute phase into the exchange phase, or the juncture transitioning from the exchange phase into the compute phase, or both. That is, to say either all processing chips are required to complete their respective compute phase before any in the group is allowed to proceed to the next exchange phase, or all processing chips in the group are required to complete their respective exchange phase before any processing chip in the group is allowed to proceed to the next compute phase, or both of these conditions is enforced. This sequence of exchange and compute phase is repeated over multiple cycles. In BSP terminology, each repetition cycle of exchange phase and compute phase may be referred to as a "superstep".

This has the practical effect that there are circumstances when there is no simultaneous usage of all links required for accessing memory (for the purpose of completing a compute phase) and links used to exchange data between the processing chips in an exchange phase. As a consequence, there is maximum efficient use of the fixed links, without compromising memory access times or inter-processor exchange delays. It will nevertheless be appreciated that embodiments described herein have applications other than when used with BSP or other similar synchronisation protocols.

It is possible that the links could be dynamically deactivated to consume effectively no power while not in use. However, the activation time and non-deterministic nature of machine learning applications generally render dynamic activation during program execution as problematic. As a consequence, the present inventor has determined that it may be better to make use of the fact that the link power consumption is essentially constant for any particular configuration, and that therefore the best optimisation is to maximise the use of the physical links by maintaining concurrent inter processor and processor-memory activity as far as is possible.

All of the memory in the cluster is accessible to each processor without indirection via another processor. This shared memory arrangement can benefit software efficiency.

In the example shown in FIG. 1, there are two "ranks" of fabric chips, each attached to a respective upper and lower edge of the processor chip. The upper rank comprises fabric cores 40a . . . 40d, connected by respective links to each of the processor cores. For example, the processor core 22a is connected to fabric core 40a by link L1, fabric core 40b by link L2, fabric core 40c by link L3 and fabric core 40d by link L4. The lower rank comprises fabric cores 40e . . . 40h. The fabric core 40a is also connected to each of the processor cores 22a . . . 22d, by corresponding links (which are shown but not labelled in the Figure for reasons of clarity). There is no use of the longitudinal processing chip edge for beachfront.

However, there are different design choices within the overall concept. For example, the long edges of the processors could be used to provide more bandwidth to the fabric chips, and all the links emerging from the beachfront of the processor chips could be passed to a single rank of fabric chips, or to three ranks etc.

The number of fabric chips in each rank may differ from the number of processor chips. What remains important to achieve the advantages of the disclosure is that the all-to-all bipartite connectivity between the processing chips and the fabric chips is maintained, with the routing functionality and external memory access provided by the fabric chips.

Note that the use of the external connectors to provide the all-to-all bipartite connectivity in the cluster according to examples of the present disclosure does not rule out the presence of other I/O ports on the processor chips or the fabric chips. For example, certain ones of the processor chips or fabric chips in the cluster may be provided with an I/O port enabling connectivity between multiple clusters or to host devices etc. In one embodiment, the fabric chips provide this additional connectivity.

Furthermore, note that additional memory may be attached directly to the processor chips, for example along the longitudinal edges. That is, additional High Bandwidth Memory (HBM) may be provided in close proximity to the processing chip which is implemented on a silicon substrate within a package which forms a processing node. In practice, the HBM is butted up against a processing chip on a silicon substrate to be as physically as close as possible to the processing chip which provides the processing function. For example, high bandwidth memory (HBM) could be attached to the processor chips, while high-capacity memory could be attached to the fabric chips—thus, combining the advantages of both memory types in the cluster In the examples of the computers described herein, the processor chips 20 are not intended to be deployed on a standalone basis. Instead, their deployment is within a computer cluster in which the processor chips are supported by one or more fabric chip 40. The processor chips 20 connect to one another through the fabric chips 40, enabling use of all of the processor chip links L1, L2 etc. for use simultaneously as processor-to-processor links and memory access links. In this way, the computer offers a higher capacity fast memory system when compared against existing computer systems. In current computer systems, it will become increasingly expensive to provide high capacity, high bandwidth memory. Furthermore, there remain limits on the processing power which can be obtained while delivering high bandwidth memory access and high-capacity memory. The present computer may enable those limits to be exceeded.

By providing routing logic on the fabric chip, it is not necessary for the processor chip to have routing logic for the purposes of external routing functions. This allows silicon area to be freed up to maximise the per processor chip I/O bandwidth and also to maximise area available for processing circuitry within the processor core.

By locating link ports along the north and south edges, this releases the east/west edges. This either allows the processor core to extend into the east/west edges, thereby maximizing the processing capability, or allows the east/west edges to be kept free for high bandwidth memory integration.

The computer may be operated in different topologies. In one example, a group of four processor chips and eight fabric chips (as illustrated for example in FIG. 1) may constitute a cluster. Within a cluster, each group of four fabric chips connected to one of the processor chip edges is referred to herein as a rank. The cluster of FIG. 1 contains two ranks.

A pod may comprise multiple clusters. Clusters may be interconnected within a pod using a processor facing link on the fabric chip. Pods may be interconnected to each other using a pod facing link on the fabric chip.

Figure 2:
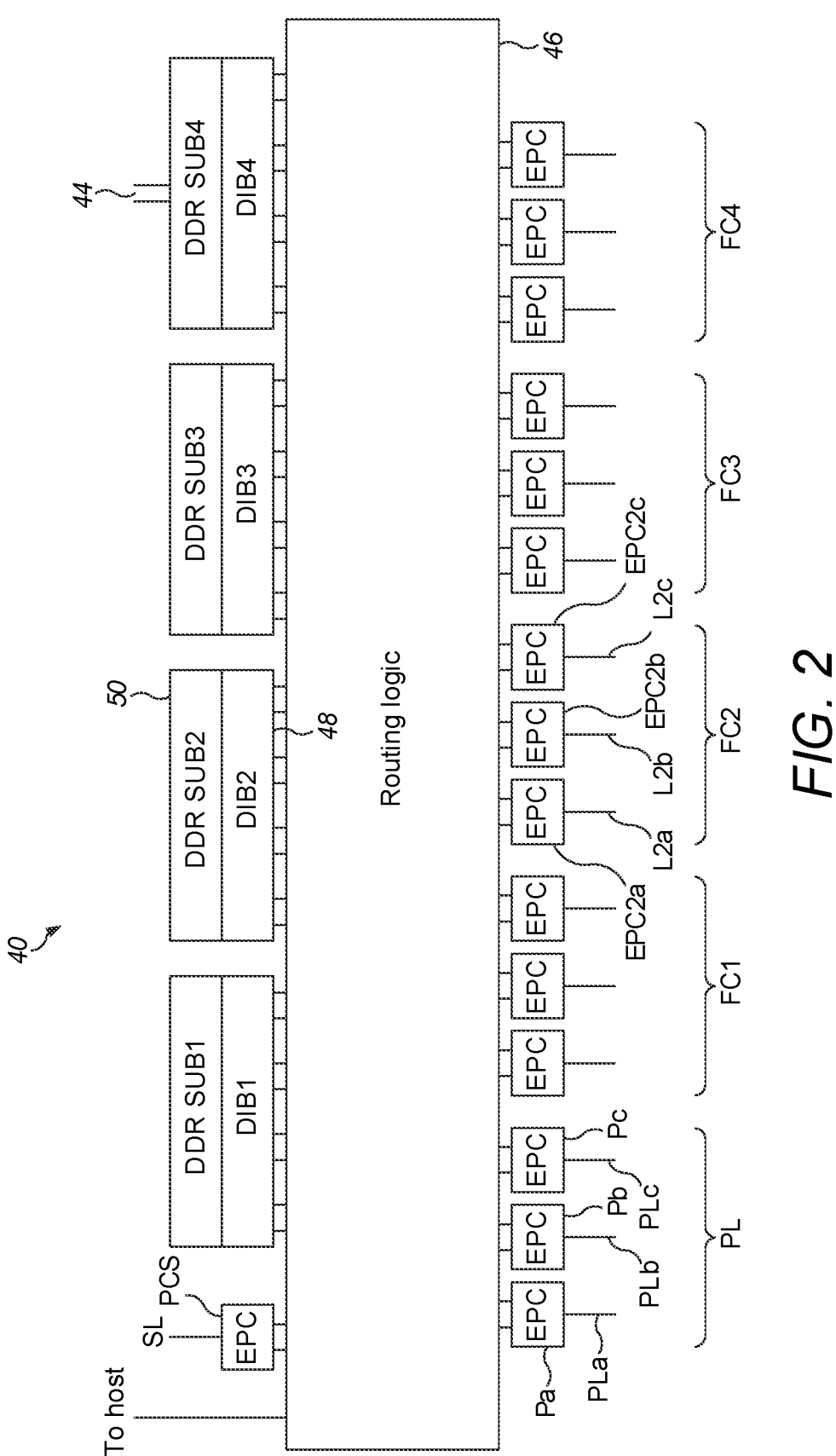
FIG. 2 is a schematic block diagram of a fabric chip.
Figure 3A:
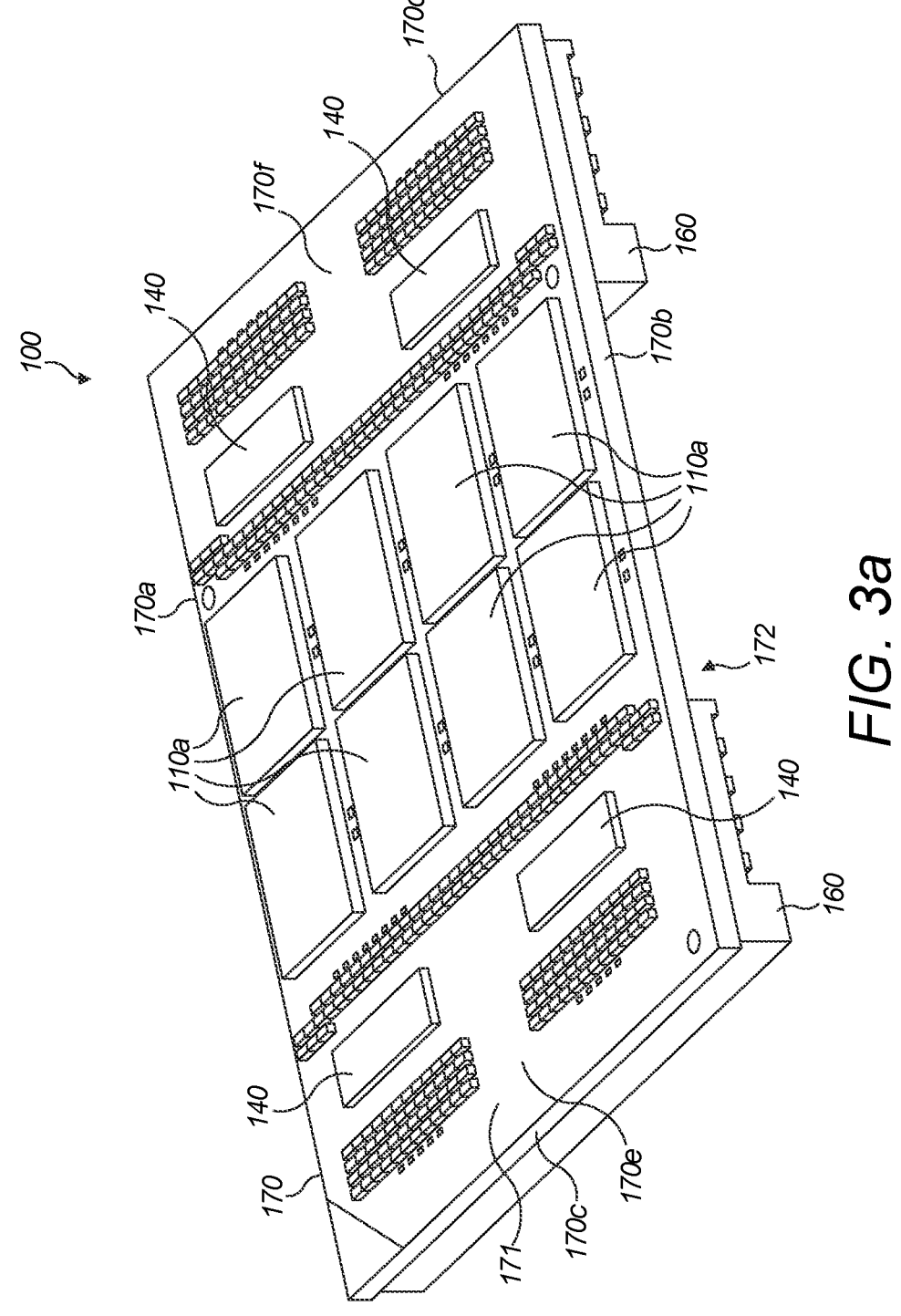
FIG. 3a is an upper perspective view of an example memory and routing module.
Figure 3B:
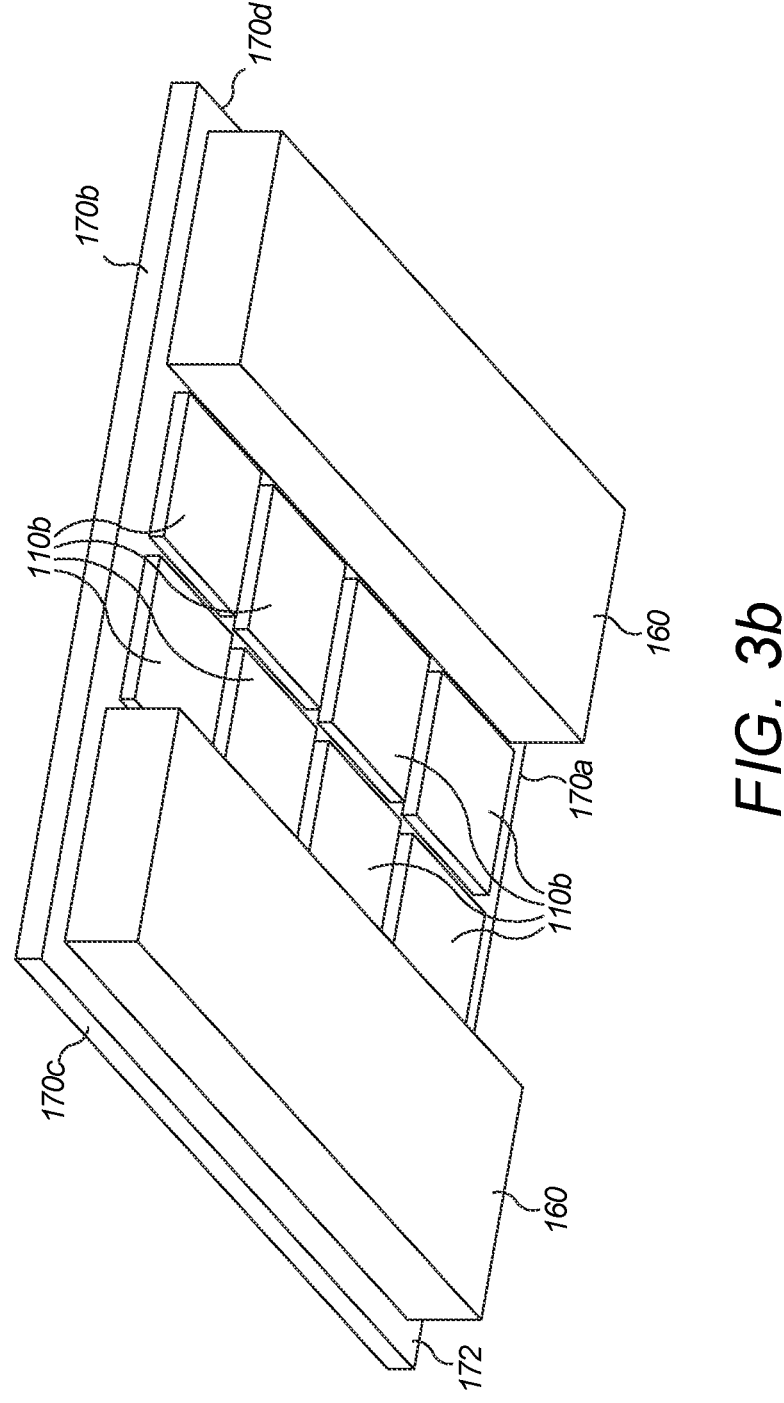
Figure 4:
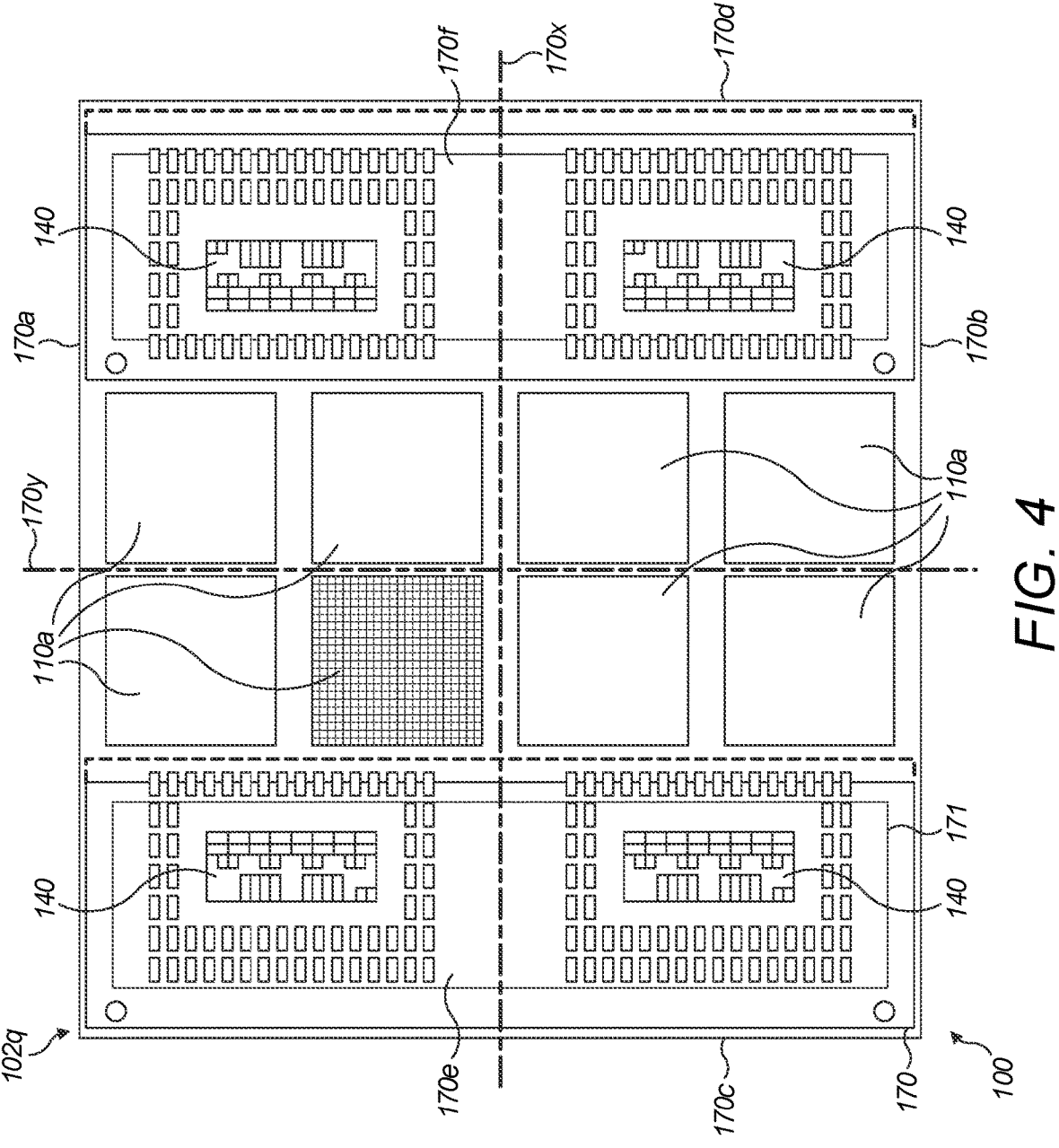
FIG. 4 is a schematic view of an upper surface of the example memory and routing module of FIG. 3.
Figure 5:
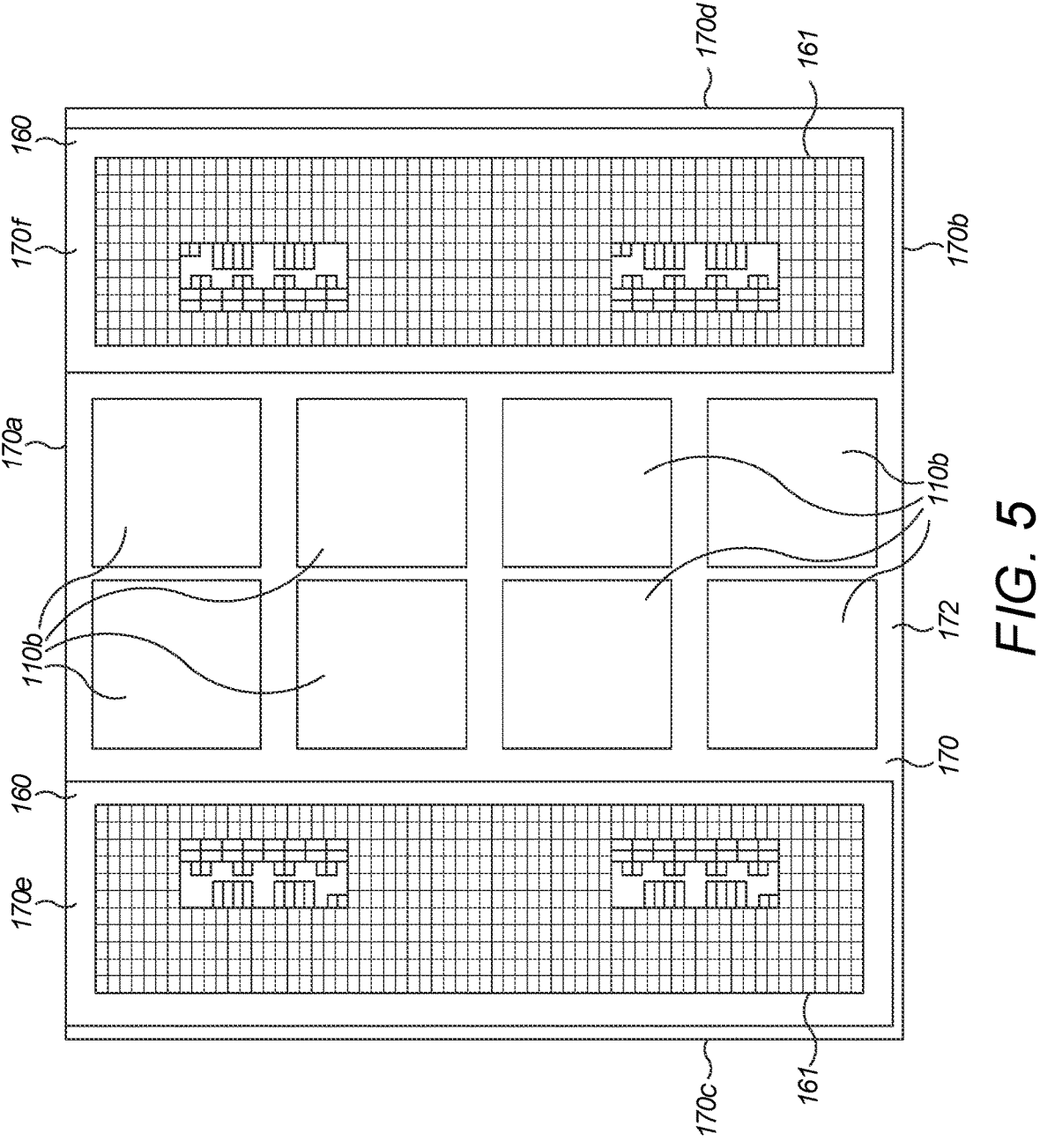
FIG. 5 is a schematic view of the lower surface of the example memory and routing module of FIGS. 3 and 4.

FIG. 2 is a schematic block diagram of components on a fabric chip 40. As shown in FIG. 2, routing logic 46 is connected to the DDR interface blocks 48 for transferring data packets between DDR interface block 48 and the other ports. The routing logic 46 is further attached to each processor connected link port. Each port comprises an ethernet port controller EPC. The routing logic is attached to ethernet port controllers of the pod facing ports, and to an ethernet port controller of a system facing link. The routing logic 46 is further attached to a PCI complex for interfacing with a host system. PCIe (Peripheral Component Interconnect Express) is an interface standard for connecting high speed computers.

FIG. 2 illustrates an example of a fabric chip which, in addition to enabling inter-processor communication, and processor-to-memory communication, enables a computer to be constructed by connecting together computer clusters in a hierarchical fashion. Firstly, the components of the fabric chip which are used for implementing the inter-processor communication, and the processor-to-memory communication will be described. Each fabric core port connection comprises three serial links. Each serial link comprises a port with an ethernet port controller (EPC). As mentioned, these links may be SERDES links, for example, twisted wire pairs enabling serial packet communication.

For reasons of clarity, not all of the components in FIG. 2 are illustrated with associated references. Each of the fabric core connections FC1, FC2, FC3 and FC4 have a configuration as now herein described with reference to fabric core port connection FC2 which connects to the second processor (for example processor 20*b* in FIG. 6). The fabric connection FC2 comprises three links L2*a*, L2*b*, L2*c*, each comprising an ethernet port controller EPC2*a*, EPC2*b*, EPC2*c* respectively. Note that in other embodiments, a single physical link may be provided, or a different number of physical links may be provided in each fabric chip connection FC. Note that the link labelled L2 in previous Figures may therefore comprise three individual serial links (such as L2*a*, L2*a* and L2*c*). Routing logic 46 in the fabric chip 40 may be implemented as a ring router, cross bar router or in any other way. The fabric chip is further connected to external memories (such as DRAMS 10A, 10B etc.) (not shown in FIG. 2). Although two DRAMS are shown in the previous Figures, in the embodiment of FIG. 2, the fabric chip is connected to four DRAMS. In order to make this connection, the fabric chip comprises four DRAM interface blocks DIB1, DIB2, DIB3 and DIB4, each associated with four DDR sub connection layers DDR sub1, DDR sub2, DDR sub3 and DDR sub4. Each DDR interface block DIB 48 incorporates a memory controller which manages access to the memory which is attached to the block. One memory attachment interface 44 is shown in FIG. 2, but it will be appreciated that each DDR sub layer has a respective memory attachment interface for attaching to external DRAM. The routing logic 46 is configured to route memory access packets received from an attached processor core to the addressed one of the data interface blocks DIB1 to DIB4. The routing logic 46 is further configured to route packets from one attached processor chip to another attached processor chip via the respective fabric chip ports. In certain embodiments, the routing logic prevents a memory packet (such as a memory access response packet) from being routed from one memory attachment interface to another memory attachment interface. A memory response packet in such embodiments may only be routed to a processor chip via the correct port attached to the routing logic 46. For example, incoming packets on link L2*a* of fabric core port connection FC2 will be routed, based on routing information in the packet, to the addressed port connected to the routing logic 46. For example, if the packet is intended to be routed to the processor 20*c*, the routing logic 46 will identify the processor 20*c* from the routing information in the packet and cause the packet to exit through the ethernet port controller onto the link attached to the processor 20*c*.

Should the packet be a memory access packet, the routing logic routes the packet based on the memory address in the packet to its appropriate DDR interface block. Note that in this embodiment each DDR interface block DIB1 . . . DIB4 comprises four memory access channels. It will be appreciated that any number of memory access channels may be provided by each interface block DIB1 . . . DIB4. The memory access channels are managed by the memory controller in each data interface block DIB1 . . . DIB4.

As explained above, in the example shown in FIG. 2, the fabric chip 40 has additional components which allow a computer to be made up of interconnected clusters. To this end, the fabric chip comprises a pod facing port connection PL. The pod facing port connection PL comprises three ports, each port comprising an ethernet port controller Pa, Pb, Pc connected to a respective link. The routing logic detects packets whose packet information indicates that the packets should not be routed to a processor within this cluster, but should instead be routed to a processor of another cluster, and routes the packet to one of the pod facing ports. Note that the pod facing port connection PL may transmit packets to a corresponding pod facing port in a fabric chip on another cluster, or may receive packets from a corresponding pod facing port on a fabric chip of another cluster.

The fabric chip of FIG. 2 also permits a packet to be routed to another pod within a system. To this end, a system port SL is provided. The system port comprises a corresponding ethernet port controller EPC and is connected to a system's serial link which is connected to a corresponding port in another pod. The routing logic may determine that a packet is intended for routing to another pod in the system and transmit the packet to the system port SL. Packets may be received over the system port SL from a corresponding system port of another fabric chip in another pod in the system which is connected via a system serial link, and be applied to the routing logic.

It will be appreciated that any type of routing logic could be utilised to route traffic from one external connection of the fabric chip to another connection of the fabric chip, either to another processor chip via an external port or to attached memory via a memory attachment interface. The term data packet when used herein denotes a sequence of bits comprising a payload to be transmitted either between processor chips or between a processor chip and memory attached to a fabric chip. The packets include information, such as destination identifiers and/or memory addresses for routing purposes. In some embodiments, a destination processor identifier may be included in a packet header. One type of ring routing logic is described in Graphcore's GB patent application no. GB2115929.8.

As described herein, each processing chip is capable of implementing a processing or compute function. There are many possible different manifestations of a suitable processing chip. Graphcore have developed a intelligence processing unit (IPU) which is describe for example in U.S. patent application Ser. Nos. 15/886,009; 15/886,053; 15/886,131 [PWF Refs. 408525US, 408526US and 408527US] the contents of which are herein incorporated by reference. The processing chip may comprise a plurality of tiles that communicate with each other using a time deterministic exchange.

The description above sets out the logical arrangement of the computer systems described herein, including the processor cores 22 or chips 20, fabric chips 40 and DRAMs 10. Hereinbelow, the physical layout and construction of some elements of the computer systems will be described in further detail.

Turning now to FIGS. 3a to 6b, there is shown a memory and routing module 100 according to an example of the disclosure.

The module 100 comprises a plurality of fabric chips 140, a plurality of DRAMs 110, and two connection components 160. The fabric chips 140 and DRAMs 110 correspond to the fabric chips 40 and DRAMs 10 discussed hereinabove. That is to say, the fabric chips 140 and DRAMs 110 discussed below incorporate the features discussed above in respect of fabric chips 40 and DRAMs 10. The fabric chips 140 on the module 100 include memory controllers for accessing the DRAMs 110.

The fabric chips 140, DRAMs 110 and connection components 160 are attached to a substrate 170, which takes the form of a planar board. The board may be approximately 80 mm×70 mm, for example 77 mm×69 mm to give a surface area of approximately 5300 to 5400 mm².

An upper side 171 of the substrate 170 supports eight DRAMs 110a, which may for example be arranged in a two×four grid, extending from one edge 170a of the substrate to an opposing edge 170b. The two×four grid of DRAMs 110a is arranged approximately equidistant between two other edges 170c, 170d, effectively forming a strip along the middle of the module 100.

The lower side 172 of the substrate also supports eight DRAMS 110b. The DRAMs 110b on the lower side 172 of the substrate are positioned at locations corresponding to the DRAMs 110a on the upper side 171. In other words, each DRAM 110a on the upper side 171 is positioned directly above a DRAM 110b on the lower side 172.

It will be appreciated that "upper side" and "lower side" used herein are merely labels referring to the two sides of the substrate 170, and that in use the module 100 may be mounted such that the lower side 172 is not below the upper side 171.

Each DRAM 110 may be a DDR (double data rate) DRAM. In one example, each DRAM is an LPDDR (low-power DDR) DRAM, such as an LPDDR5 DRAM. Each DRAM may have a capacity of 16 GB, though in other examples the capacity may be 24 GB or 32 GB. LPDDR DRAMs are designed for mobile computing contexts (e.g. on mobile telephones or laptop computers). However, the inventors have found that such memory can advantageously provide high-capacity, low-latency memory suitable for meeting the demands of artificial intelligence/machine learning models in high-performance computing contexts.

The module 100 further comprises four fabric chips 140, located on the upper side 171. The fabric chips 140 may also be referred to herein as "routing chips" or "memory attachment and routing chips", in view of their above-described function of routing signals between different processor cores 22 and between the processor cores 22 and the DRAMS 110. Each fabric chip 140 is positioned in a region 170e or 170f between an edge 170c or 170d of the substrate and the strip of DRAMs 110.

Each fabric chip 140 is proximate to a different pair of DRAMs 110a on the upper side 171, and so consequently, a further pair of DRAMs 110b on the lower side 172. The fabric chip 140 is connected to those four proximate DRAMs 110. In one example, the fabric chip 140 is connected only to those four proximate DRAMs 110.

The module 100 can therefore be divided into four notional quadrants by a first notional line 170y extending between the middle of edge 170a and 170b, and a second notional line 170x extending between, each quadrant comprising a fabric chip 140 and four DRAMs 110a,b connected to the fabric chip 140. The module is reflectionally symmetrical in both lines 170x and 170y. One quadrant 102q of the module 100 is indicated on FIG. 4. Each quadrant 102q can be considered a sub-module of the module 100.

The module 100 comprises two connection components 160 disposed on the lower side 172 of the substrate 170. One connection component 160 is positioned on the underside of region 170e and the other connection component 160 is positioned on the underside of region 170f, and so each connection component 160 is underneath two of the fabric chips 140. Each connection component 160 is configured to mate with a corresponding connection component formed on a motherboard 400, which will be discussed in more detail below. Accordingly, the module 100 is connectable to, and disconnectable from, the motherboard by virtue of the connection components 160. The connection components 160 therefore form the electrical coupling or link between the module 100 and the rest of the system beyond module 100.

The module 100, and more particularly each fabric chip 140, connects to the processor cores 22 through the connection components 160. Each connection component provides a plurality of connectors (e.g. pins). Each fabric chip 140 connects via one or more connectors of the connection component 160 which it is disposed above. Accordingly, the connectors of the connection component 160 can be considered part of the physical embodiment of the links L1-L4 discussed above in relation to FIG. 1, in that they are part of the signal path that extends between the processor cores 22 and fabric chips 140.

The connectors of the connection component 160 also provide part of the physical embodiment of the link between each module 100 and other modules 100 in other pods, and the links to the rest of the system. The module 100 therefore does not include a processor core 22, but instead provides routing for data between processor cores 22 as well as memory access. In other words, the only processing power on the module 100 may be that provided in the fabric chips 140. The processor cores 22 are disposed remote from the module 100 and do not form part of the module 100.

Furthermore, as discussed above, there are no high-bandwidth direct connections between fabric chips 140. Accordingly, each fabric chip 140 on the module 100 is not connected to the other fabric chips 140 on the same module 100.

Each connection component 160 may take the form of a mezzanine connector. The connection components 160 may be hermaphroditic mezzanine connectors, which may for example have eleven rows, each row having fifteen pairs of pins, which may also be referred to as connectors. An example pair of pins 161 is labelled on FIG. 4—for clarity the remaining pins have not been labelled. The mezzanine connector may be a Mirror Mezz connector supplied by Molex®. In other examples, other connection components 160 may be employed. For example, connectors supplied Samtec®, TE Connectivity® or Amephenol® may be used. The connection components 160 are also part of the physical linkage between the module 100 and the motherboard, providing physical support to the module 100.

The structure of the substrate 170 and the connections between the elements of the module 100 and the substrate 170 will now be further discussed.

The substrate 170 is a package substrate. Accordingly, the substrate 170 is not a traditional printed circuit board, but instead is a substrate of the type that is typically used inside a chip package to support a die of the chip. The substrate 170 may also be referred to as a high-density interconnect (HDI) substrate or interposer substrate. It will be understood that the use of the term "interposer" in this context does not imply that the substrate acts as an intermediate or interposed layer, but instead is merely a reference to the type of substrate employed. As will be apparent from the description herein, the package substrate 170 is the main substrate of the module 100 and does not act as an interposer.

In one example, the package substrate 170 is a High Tg glass epoxy multilayer material, such as MCL-E-705G provided by Hitachi®.

In one example, the substrate 170 is monolithic. In other words, the substrate 170 is a single, unbroken substrate. In other examples, the substrate 170 may comprise two or more substrates coupled together, either physically, electrically or both.

Figure 6A:
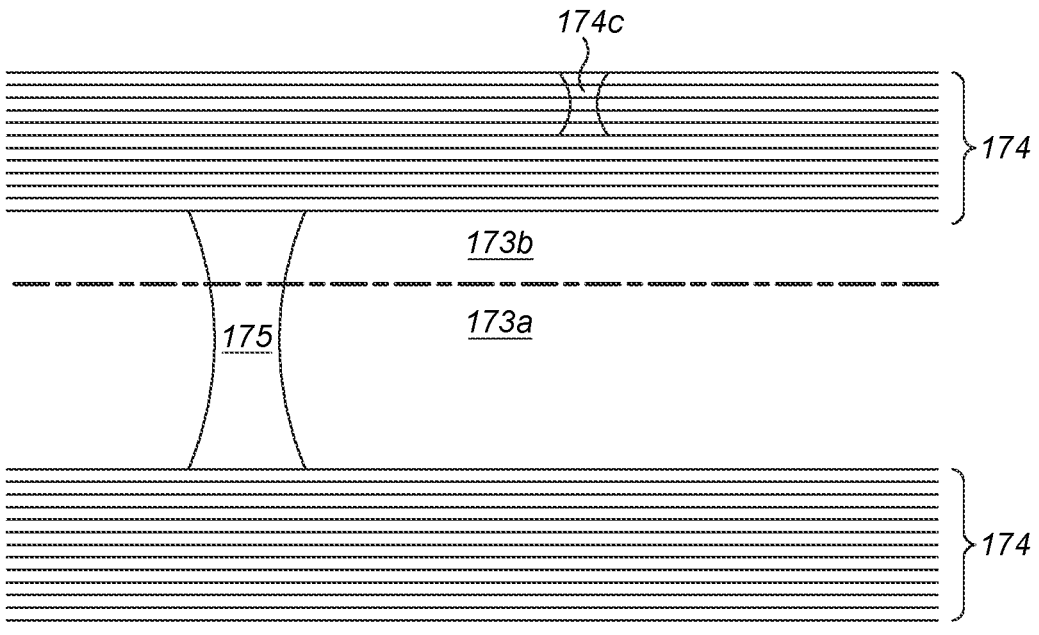
FIGS. 6a and 6b are schematic views of a substrate of the example memory and routing module of FIGS. 3 to 5.

As shown in FIG. 6a, the interposer substrate 170 comprises a core 173, and a plurality of build-up layers 174 formed on the core 173. The core 173 has two layers 173a, 173b, the first core layer 137a being insulative and acting to provide strength to the substrate. The second core layer 173b may be a copper layer. The core 173 may be approximately 1.2 mm in thickness.

Figure 6B:
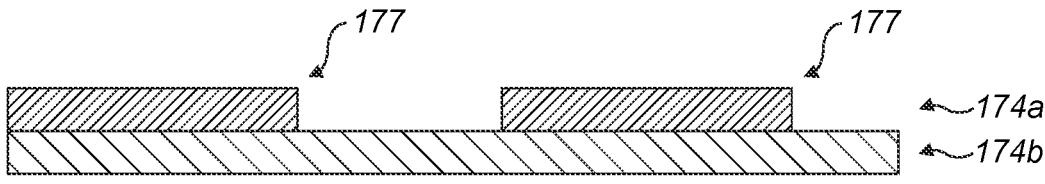
Figure 7:
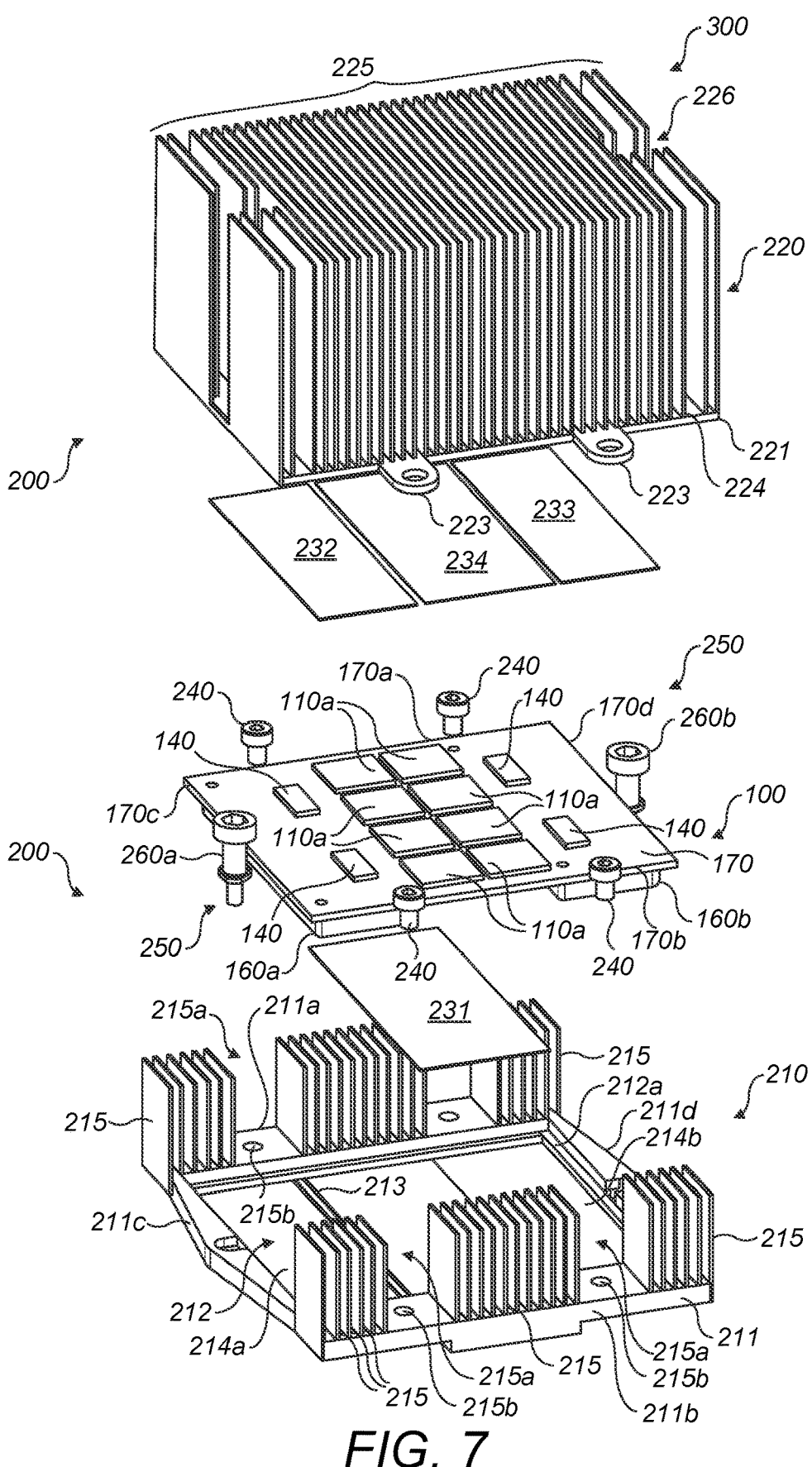
FIG. 7 is an upper exploded perspective view of an example assembly comprising a heatsink and a memory and routing module.

The build-up layers 174, which are shown in more detail in FIG. 6b, each carry a plurality of conductive lines or wires 177 that electrically connect the elements of the module 100. The build-up layers 174 may each comprise a copper foil sublayer 174a from which the conductive lines are formed and an insulative sublayer 174b, to isolate each build-up layer 174 from other build-up layers 174. Each copper foil sublayer 174a may be approximately 12 microns thick. Each insulative sublayer 174b may be approximately 30 microns thick. Accordingly, it will be appreciated that FIG. 6a is not to scale and exaggerates the size of the build-up layers 174 relative to the core 173.

In one example, six build-up layers 174 are formed on each side of the core 173, to give a 6:2:6 interposer substrate. The build-up layers 174 on one side of the substrate 170 may each have a different function. For example, one or more of the layers 174 may be a ground layer comprising conductive lines 177 connected to ground. One or more of the layers may be a VDD layer, comprising conductive lines 177 connected to VDD. One or more of the layers 174 may be a signal layer, carrying signals between the connection components 160 and the fabric chips 140, and between fabric chips 140 and the DRAMs 110. In one example, two of the build-up layers 174 are signal layers. The outermost layer 174 may comprise pads (not shown) for connection to the other elements of the module 170.

Furthermore, as illustrated in FIG. 6a, vias 174c may be formed between build-up layers 174, so that the conductive lines 177 may pass between layers 174. In addition, core vias 175 may also be formed through the core 173, so that the conductive lines 177 may pass from the upper side of the substrate 170 to the lower side of the substrate 170.

The fabric chips 140 are flip chips, secured directly to the substrate 170. In other words, the fabric chips 140 are semiconductor chips fabricated to include solder bumps on a surface of the die thereof. These bumps are then directly attached to the substrate 170. In one example, the bump pitch in a core region of the chip is approximately as follows:

x=261 microns
    y=154 microns
    diagonal pitch=151 microns where x is the width direction between long edges of the chip, and y is the length direction between short edges of the chip. The pitch may be wider in areas where the connection is provided to the DRAMs 110, for example x=286 microns, y=164 microns, diagonal pitch=167 microns.

The conductive lines 177 of the interposer substrate 170 are sufficiently fine in the regions of the substrate 170 under each fabric chip 140 to allow the lines to breakout from the footprint of the chips 140.

The DRAMs 110 are attached to the substrate 170 using a ball grid array (BGA). That is to say that the DRAMs 110 each take the form of a packaged semiconductor chip comprising a die and a package substrate. The die is secured to the upper side of the package substrate, and electrically connected thereto. The package substrate has a grid of solder balls formed on the underside thereof, which are in turn secured to corresponding conductive pads on the substrate 170. The BGA may for example have a pitch of 650 microns. The pitch of the balls is therefore substantially coarser than the bumps of the fabric chip 140.

The connection components 160 may also be connected to the substrate 170 via a BGA. Each connection component 160 therefore may comprise a grid of solder balls disposed on a face of the connection component 160 opposing the face including the pins 161.

Returning to FIGS. 3a and 4, the die of the fabric chip 140 is rectangular and has two opposing long edges 140a, 140b and two opposing short edges 140c, 140d. The short edges 140c, 140d are approximately 6 mm long. The long edges 140a, 140b are approximately 15 mm long. In one example, each fabric chip is 5.5 mm×15.3 mm. Accordingly, the aspect ratio of the chip 140 is approximately 3:1. In one example, the fabric chip 140 is a single or monolithic die.

The fabric chip 140 comprises a plurality of memory controllers. Each memory controller 142 is a circuit formed in the die of the chip, which acts as an interface to the DRAMs 100. In examples where the DRAMs are LPDDR DRAMs, the memory controllers are LPDDR interfaces. The LPDDR interfaces implement the relevant LPDDR standard (e.g. a JEDEC standard, for example JESD209-5B). In examples where the DRAMs 110 are of a different type, the memory controllers 142 may accordingly implement the standard necessary to access the DRAMs 110.

The memory controllers 142 are arranged on one long side 140a of the chip 140. Each chip 140 is arranged on the module 100 so that this side 140a faces the DRAMs 100. This arrangement may ease breaking out the connections to the DRAMs 100 from under the footprint of the chip 140.

Each memory controller forms part of the DDR interface blocks 48 discussed above. Accordingly, the routing logic of the fabric chip 140 is configured to route signals to and from the DRAMs 110 using the trunk nodes 46.

The fabric chip 140 furthermore comprises a plurality of link controllers. Each link controller may comprise a circuit formed in the die. Each communication lane provided by the link controllers may be a serial link, such as a SERDES link as discussed above. Accordingly, the link controller may comprise an analogue circuit. In one example, the link controllers provide 100 Gbps links.

The link controllers provide communication lanes for communication with respective processor cores 22. As discussed above in relation to FIG. 1, three links (e.g. L2a, L2b, L2c) are provided to each processor core. Accordingly, each communication lane corresponds to an EPC (e.g. EPC2a, EPC2b, EPC2c) shown on FIG. 1.

The link controllers may also provide three lanes of pod-facing communication. The communication lanes may implement EPCs corresponding to Pa, Pb, Pc of FIG. 1 to implement pod-facing links PLa, PLb, PLc. The pod-facing links PL may also be termed cluster connecting links, in that they connect the fabric chip to another cluster.

The link controllers may also comprise a lane of system facing communication. Accordingly, one of the communication lanes implements an EPC (i.e. corresponding to PCS of FIG. 1) to provide the system link SL. The system link SL is for example connected to a switching fabric. The link controllers may also provide a PCIe link to a host computer.

The link controllers may be arranged along the opposite long edge 140b to the memory controllers 142. Again, this may assist in easing the breakout of lines from under the fabric chip 140.

Figure 17:
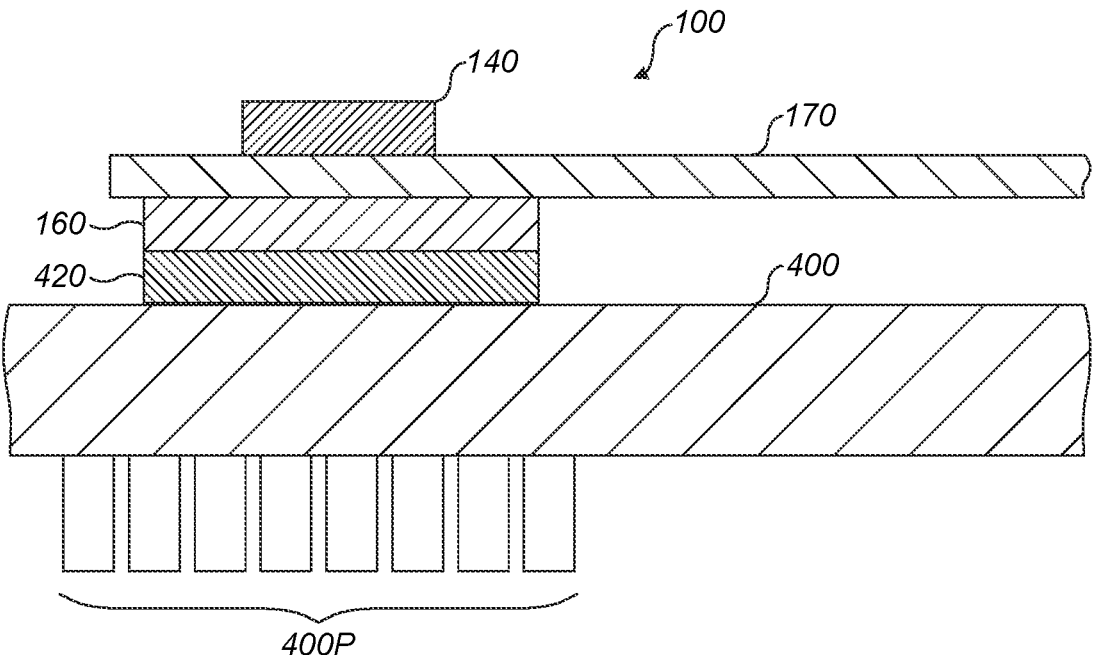
FIG. 17 is a schematic cross section view of the example memory and routing module of FIGS. 3 to 6 and a motherboard.

FIG. 17 illustrates an example power supply arrangement for the module 100. As shown in FIG. 17, the motherboard 400 to which the module 100 may be attached comprises power supply components 400P. The power supply components 400P may for example comprise a point of load power supply, disposed on an opposing side of the motherboard 400 to the module 100. Power is supplied from the power supply components 400P through the connection components 420 and 160 to the fabric chip 140.

Accordingly, the module 100 may not comprise a power supply, such as a point of load power supply. This allows the substrate 170 to be made smaller, reducing the use of the relatively high-cost substrate material. Furthermore, the positioning of the fabric chip 140 on the other side of the substrate 170 directly above the connection component 160 minimises the distance between the power supply components 400P and the fabric chip 140, reducing the IR drop.

As set out above, the memory and routing module 100 comprises a plurality of fabric chips 140 and a plurality of DRAMs 110. In use, these components generate heat, which may lead to damage of the fabric chips 140 and/or DRAMs 110, as well as to other proximate components either on the motherboard to which the module is attached, or otherwise disposed within an enclosure housing the motherboard. Accordingly, there is a need to effectively dissipate the heat generated by the module 100.

Issues may arise with the double-sided construction of the module 100, and in particular the DRAMs 110b disposed on the lower side 172 of the module 100. These DRAMs 110b are disposed between the substrate 170 and the motherboard in use, and the DRAMs 110b are positioned in a relatively narrow channel defined by the connection components 160 on either side of the DRAMs 110b. This may make it difficult to effectively dissipate heat from the underside of the module 100.

FIGS. 7 to 13e illustrate a heatsink 200 provided to address these issues.

The heatsink 200 comprises a lower heatsink component 210 and an upper heatsink component 220.

The lower heatsink component 210 is configured to receive the lower side 172 of the module 100. The lower heatsink component 210 comprises a plate 211 having a recess 212 formed therein. The plate 211 may have dimensions of approximately 90 mm×100 mm, with the recess 212 formed approximately in the centre of the plate 211. The main body of the plate 211 has four peripheral edge regions: two opposing edge regions 211a, 211b which are respectively arranged at the edges 170a, 170b of the module 100 in use, and two opposing edge regions 211c, 211d, which are respectively arranged at the edges 170c, 170d of the module 100 in use. The edge regions 211a-d may be collectively referred to as the peripheral region of the lower heatsink component 210.

The upper side of recess 212 has a length and width that correspond to the dimension of the substrate 170 of the module 100. The lower side of the recess 212 includes a flange 212a, which extends laterally into the recess 212 to engage with a peripheral edge region of the lower side 172 of the substrate 170. Accordingly, once inserted into the recess 212, the module 100 cannot move laterally and is effectively captured by the recess 212 of the lower heatsink component 210. Therefore, the lower heatsink component 210 effectively comprises a tray in which the substrate 170 sits. The recess 212 is an example of a module receiving region of the lower heatsink component 210.

The recess 212 comprises two apertures 214a,b, which extend through the plate 211. The apertures 214a,b are sized to allow a respective one of the connections components 160a,b to extend therethrough, so that they protrude from the underside of the lower heatsink component 210 when the substrate 170 rests on the flange 212a.

The lower heatsink component 210 further comprises a cross member 213 extending across the recess 212 from peripheral edge region 170a to peripheral edge region 170b. The cross member 213 forms the inner boundary of each of the two apertures 214a,b. The cross member 213 is coupled to the underside of the plate 211. The cross member 213 is positioned under the DRAMs 110b of the module 100, with its major surface facing the DRAMs 110b. The cross member 213 is therefore arranged to conduct heat generated by the DRAMs 110b to the plate 211.

The cross member 213 comprises thermal interface material 231 disposed on its upper surface. The thermal interface material 231 has high thermal conductivity. This assists in heat transfer and ensures conformant thermal conduction over the cross member 213. This assists in situations where a particular DRAM of the DRAMs 110*b* is generating excess heat, but other DRAMs 110*b* are not. The cross member 213, or more particularly the thermal interface material 231 disposed thereon, may be in direct contact with the DRAMs 110*b*.

The thermal interface material 231 may be a thermally conductive pad, for example a silicone pad. Particularly, the thermal interface material 231 may be a pad of Tpli™ 200, supplied by Laird™. However, other suitable thermal interface materials may be employed, including thermal pastes, thermal adhesives, phase-change materials and so on.

The plate 211 of the lower heatsink component 210 comprises a plurality of fins 215. The fins 215 are upstanding on an upper surface of the plate 211. In the example shown, the fins 215 are substantially rectangular, but in other examples the shape may be varied or other heat dissipating structures or elements may be employed. For example, square or circular fins may be employed, or fins of any other suitable shape. The fins 215 are generally arranged in two rows, one disposed along peripheral edge 211*a* and one along peripheral edge 211*b*.

Gaps 215*a* are formed in the rows of fins 215 to accommodate means for attaching the upper heatsink component 220 to the lower heatsink component 210, which will be discussed in more detail below. Two breaks 215*a* may be formed in each row, to provide four locations for the attachment of the upper heatsink component 220. In each gap 215*a*, a threaded bore 215*b* is formed in the plate 211.

The peripheral edges 211*c,d* of the lower heatsink component 210 comprise part of the mounting system 250 for attaching the module 100 and heatsink 200 to the motherboard 400, which will be discussed in further detail below with reference to FIG. 13.

The upper heatsink component 220 comprises a base plate 221. The lower side 222 of the base plate 221 faces the upper side 171 of the module 100, so as to conduct heat generated by the fabric chips 140 and DRAMs 110*a* disposed on the upper side 171. The lower side 222 of the base plate 221 comprises three regions 222*a,b,c*. Regions 222*a* and 222*b* respectively correspond to the regions 170*e*, 170*f* in which the fabric chips 140 are located. Region 222*c* is disposed in between the regions 222*a*, 222*b* and corresponds to the location of the DRAMs 110*a* on the upper side 171 of the module 100. The region 222*c* may be recessed to accommodate the DRAMs 110*a*, which may be taller than the fabric chips 140.

Thermal interface material may be disposed on the lower side 222. As discussed above, the thermal interface material 231 has high thermal conductivity and thus assists in conformant thermal conduction over the plurality of fabric chips 140 and DRAMs 110*a* disposed on the upper side 171. The thermal interface material may be provided in three portions 232, 233, 234, each portion disposed in a corresponding one of the regions 222*a,b,c* The lower side 222, or more particularly the thermal interface material 232-234 disposed thereon, may be in direct contact with the DRAMs 110*a* or fabric chips 140.

Like the thermal interface material 231, the thermal interface materials 232, 233, 234 may be a pad of silicone, for example Tpli™ 200, supplied by Laird™. However, other suitable thermal interface materials may be employed, including thermal pastes, thermal adhesives, phase-change materials and so on. Different thermal interface materials may be employed for each of material sections 231-234—it need not be the case that all of the thermal interface materials are the same.

Figure 10:
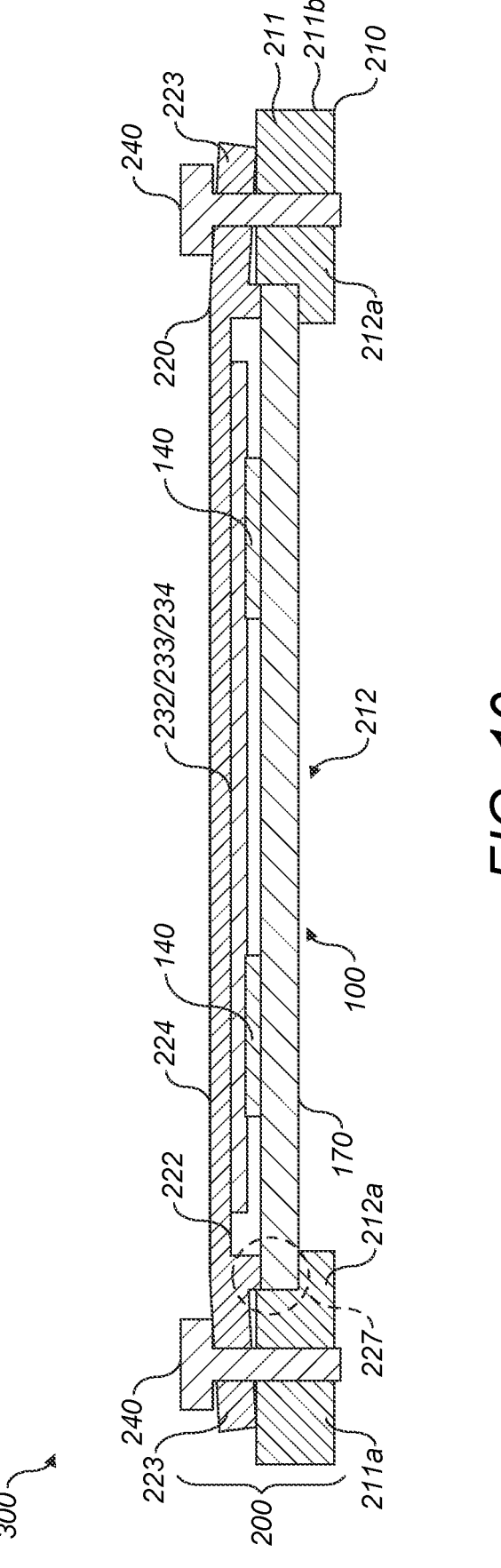
FIG. 10 is a schematic cross section diagram of the example assembly of FIGS. 7 to 9, with the fins omitted.

The base plate 221 further comprises lugs or tangs 223 extending laterally outwards from the sides thereof. The lugs 223 are disposed at locations corresponding to the threaded bores 215*b*, so that threaded fasteners 240 can be passed through the lugs 223 and driven into the bores 215*b* to secure the upper heatsink component 220 to the top of the lower heatsink component 210. As shown in FIG. 10, the lugs 223 are configured to deform, for example by bending downwards during attachment. Furthermore, the upper heatsink component 220 may contact the substrate 170 in a region 227 directly above the flange 212*a*, so as to securely clamp the module 100 in place.

The force required to mate the connection component 160 with the corresponding connection component 420 is high. Furthermore, the material of the substrate 170 may be relatively weak, as well as being high cost. By clamping the substrate 170 in this manner, damage to the substrate 170 and components or solder joints thereof may be avoided, because the whole assembly 300 is attached and detached from the motherboard 400. In other words, the substrate 170 need not be directly handled during attachment or detachment of the assembly 300. Accordingly the components of the heatsink 200 provide stiffness to the substrate 170, preventing the bending thereof and generally protecting the substrate 170.

The upper side 224 of the base plate 221 comprises a plurality of fins 225. The fins 215 are upstanding on an upper surface of the plate 211. In the example shown, the fins 215 are substantially rectangular, but in other examples the shape may be varied or other heat dissipating structures or elements may be employed. The fins 215 are generally arranged in a single row, covering almost all of the base plate 221 apart from regions 226 which accommodate the mounting system 250.

In some examples, the heatsink 200 is substantially formed of aluminum. For example, the component 210 and 220 may be formed of or comprise aluminum. In other examples, the heatsink 200 may be formed of or comprise other thermally conductive materials, including copper and graphene. In some examples, the fasteners 240 are formed of another material, which may be stronger than aluminum. For example, the fasteners 240 may comprise steel, such as plated steel.

In use, an assembly 300 is formed from the heatsink 200 and module 100 as follows. Firstly, thermal interface material as 231 is applied to the cross member 213. The module 100 is then seated in the recess 212 of the lower heatsink component 210, with the connection components 160 extending through the apertures 214.

Subsequently, the thermal interface material 232, 233, 234 is applied to the lower side 222 of the upper heatsink component 220. The upper heatsink component 220 is then placed on top of the module 100, with the DRAMS 110*a* housed in the recessed region 222*c* of the lower side 222. The fasteners 240 are driven through the lugs 223 and into the bores 215*b*, until the lugs 223 deform downward to securely clamp the upper heatsink component 220 to the lower heatsink component 210.

The heatsink 200 assembled with the module 100 provides a passive cooling mechanism for the semiconductor chips (i.e. the fabric chips 140 and DRAMs 110) disposed on the module 100. By passive, it is meant that the heatsink 200 comprises no moving parts such as fans or other powered cooling mechanisms such as refrigerated liquid or gas. It will be appreciated that the enclosure in which the heatsink 200 is disposed may comprise fans and/or means of cooling the air (or other gas) within the enclosure, so as to provide cooling by forced convection.

During operation, the heatsink 200 conducts heat generate by the DRAMs 110 in a lateral direction through the cross member 213 and out to the peripheral edge region 211 of the lower heatsink component 210, whereupon the large surface area of the fins 215 assists in dissipating the heat. In addition, the tight coupling of the heatsink components 210, 220 allows heat to be conducted from the lower heatsink component 210 to the upper heatsink component 220, whereupon it can be dissipated by fins 225. Furthermore, heat generated by the fabric chips 140 and DRAMS 110a on the upper side 171 of the module is conducted through the base plate 221 and dissipated by the fins 225.

Figure 11:
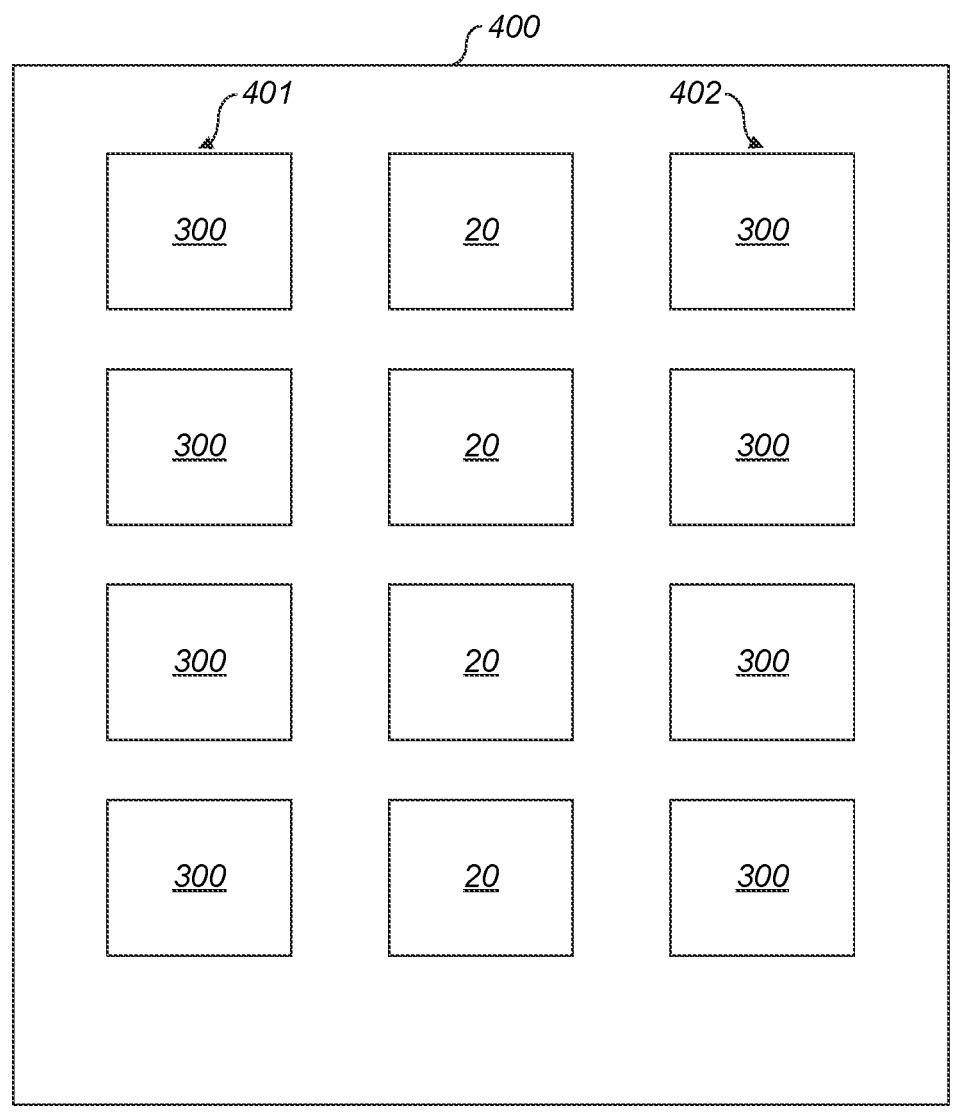
FIG. 11 is a schematic plan view of a motherboard with the example assembly of FIGS. 7 to 10 attached.

FIG. 11 schematically illustrates an example motherboard 400. The motherboard 400 may be a printed circuit board. The motherboard 400 supports a plurality of assemblies 300, each assembly 300 comprising a heatsink 200 and module 100. The motherboard 400 also supports a plurality of processor chips 20. In the example shown, the motherboard 400 supports four processor chips 20 arranged in a row extending across the motherboard 400. The motherboard 400 also comprises eight assemblies 300, arranged in two rows 401, 402. The rows 401, 402 are disposed in parallel on opposing sides of the row of processor chips 20.

Figure 12:
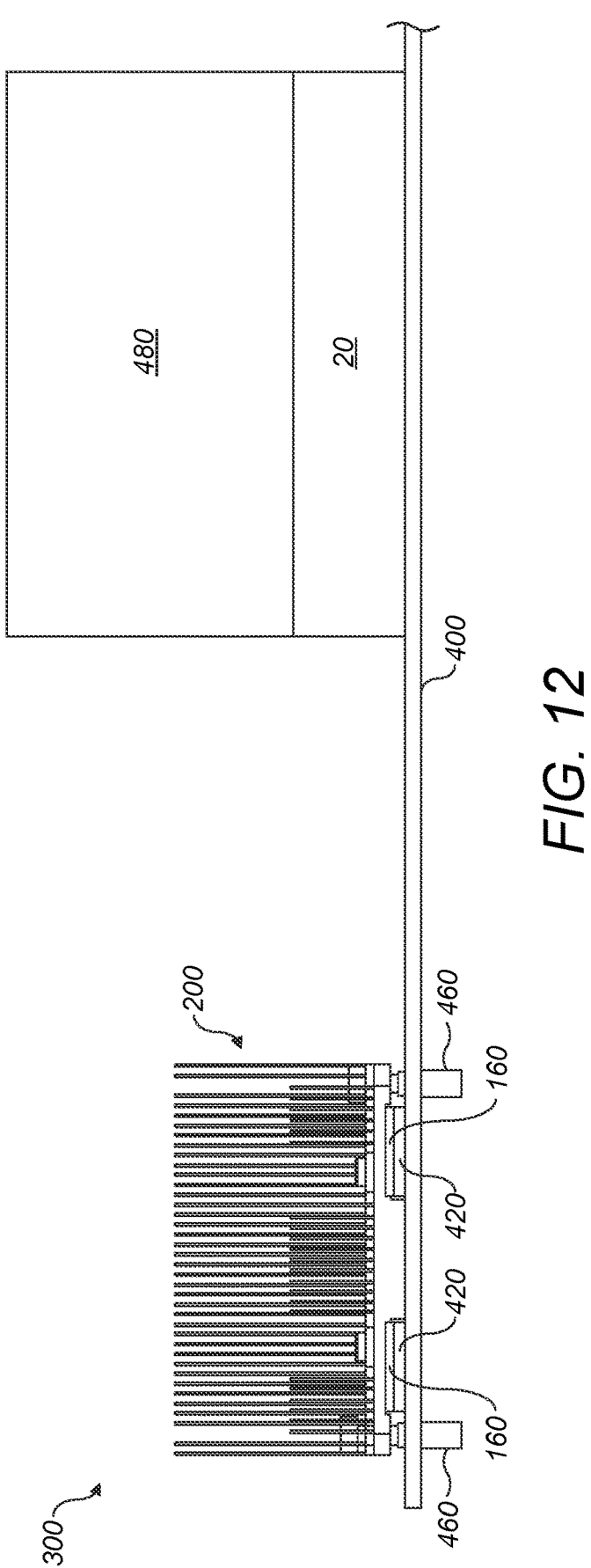
FIG. 12 is a schematic cross section view of the motherboard of FIG. 11.

As can be seen in FIG. 12, the motherboard 400 comprises a plurality of connection components 420, which are configured to mate with connection components 160 of the respective modules. The motherboard 400 comprises conductive lines or other wiring (not shown) that connects the connection components 420, and thus the installed modules 100, to the processors 20. The motherboard 400 may also comprise conductive lines or wiring (not shown) that can connect to networking hardware, power sources and the like. FIG. 12 also demonstrates that each processor 20 may be provided with a cooling apparatus 480, which may for example comprise a vapour chamber and/or an active cooling means such as a means for supplying cooled air or a refrigerated liquid to the processor 20.

FIG. 13a-e illustrate a process for attaching the assembly 300 to the motherboard 400.

As discussed hereinabove, the connection components 160 may take the form of mezzanine connectors comprising a relatively large number of pins 161. For example, one mezzanine connector 160 may comprise 688 pins. The pins 161 are relatively small and are susceptible to bending and other deformation during connection to and disconnection from the corresponding connection component 420 on the motherboard 400. This may be caused by the connection component 160 being misaligned with the corresponding connection component 420 during connection or disconnection. This may occur when one end of the connection component 160 is lifted from the corresponding connection component 420 whilst the other end remains in place, a problem which can be exacerbated by the relatively long and thin shape of the connection components 160, 420. It may also occur when one of the two connection components 160a of the module 100 is lifted from its corresponding connection component 420, whilst the other connection component 160b remains engaged. This causes the module to pivot at an angle about the connection component 160b that remains engaged, potentially deforming its pins 161. Whilst the above issues are explained in the context of a mezzanine connector 160, similar issues may arise with other connection components with relatively fine pins 161 or that are otherwise susceptible to damage during engagement or disengagement.

To address these issues, the assembly 300 comprises a mounting system 250 that ensures the connection components 160 are aligned with their corresponding connection components 420 and that limits the angle of the substrate 170 with respect to the motherboard 400 during installation and removal of the assembly 300.

The mounting 250 system is shown in FIGS. 7-9 and 13a-e, and comprises mounting fasteners 260a and 260b, which are configured to be received in respective fastener receiving sections 460 of the motherboard 400. As can be best seen in FIGS. 12 and 13e, the fastener receiving sections 460 take the form of threaded bores, which for example extend from the surface of the motherboard 400 on which the assembly 300 is mounted into bosses arranged on the opposing (e.g. lower) surface of the motherboard 400.

A first one of the mounting fasteners 260a is located at the end of the heatsink 200 corresponding in position to edge 170c of the module 100. A second mounting fastener 250b is located at the opposing end of the heatsink 200, proximate to edge 170d of the module.

Accordingly, the mounting fasteners 260 are positioned along a long edge of each of the connection components 160a and 160b, for example substantially in the middle of the long edge.

The mounting fasteners 260a,b each extend through a respective aperture 251a,b in the upper heatsink component 220. As discussed above, breaks 226 in the fins 225 of the upper heatsink component 220 accommodate and allow access to the fasteners 260. The mounting fasteners 260a and 200b further extend through respective apertures 252a and 252b in the lower heatsink component 210. The apertures 252a and 252b are formed in the peripheral edge regions 211c and 211d of the lower heatsink component, for example substantially in the middle of the respective edges. The apertures 251a and 252a form a channel through which the fastener 260a extends. The apertures 251b and 252b likewise form a channel through which the fastener 260b extends.

Figure 14:
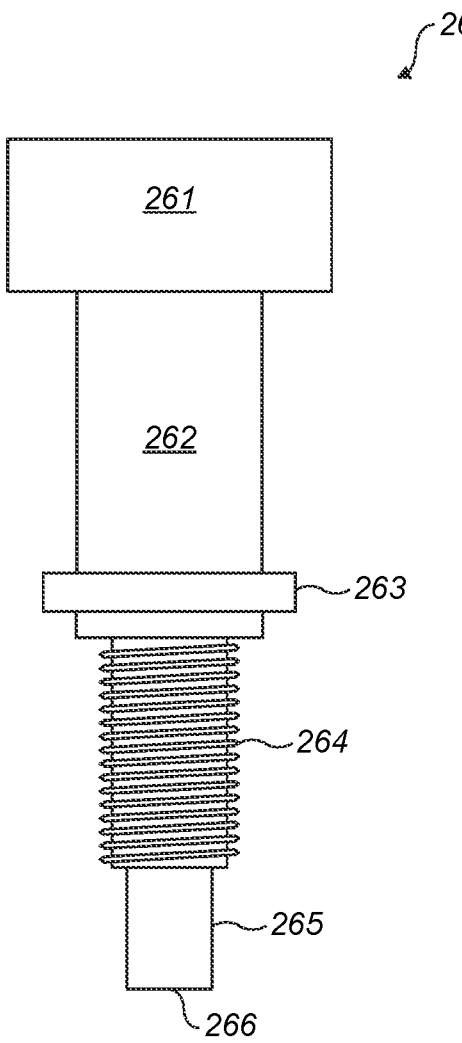
FIG. 14 is a side view of an example mounting fastener.

A mounting fastener 260 is shown in more detail in FIG. 14. The fastener 260 may take the form of a screw.

The fastener 260 comprises a head section 261 at a first or top end thereof. The head section 261 is configured to receive a driver (not shown), for rotating the fastener 260. In the examples shown, the head section 261 has a hex socket for receiving an allen key or hex key, though in other examples different drivers may be employed.

A threadless body section 262 is disposed below the head section 261, which may for example be a cylindrical body section. The threadless body section 262 is narrower than the head section 261. A collar 263 is formed around a lower region of the threadless body section 262, wherein the collar 263 extends radially outward from the body section 262, and thus forms a wider section of the threadless body section 262.

Below the threadless body 262, the fastener 260 comprises a threaded section 264 configured to engage with the threaded bore of the receiving section 260. The second or bottom end of the fastener 260 comprises an unthreaded locating projection 265 having a substantially flat tip 266, which may be referred to as a "dog point".

Figure 13A:
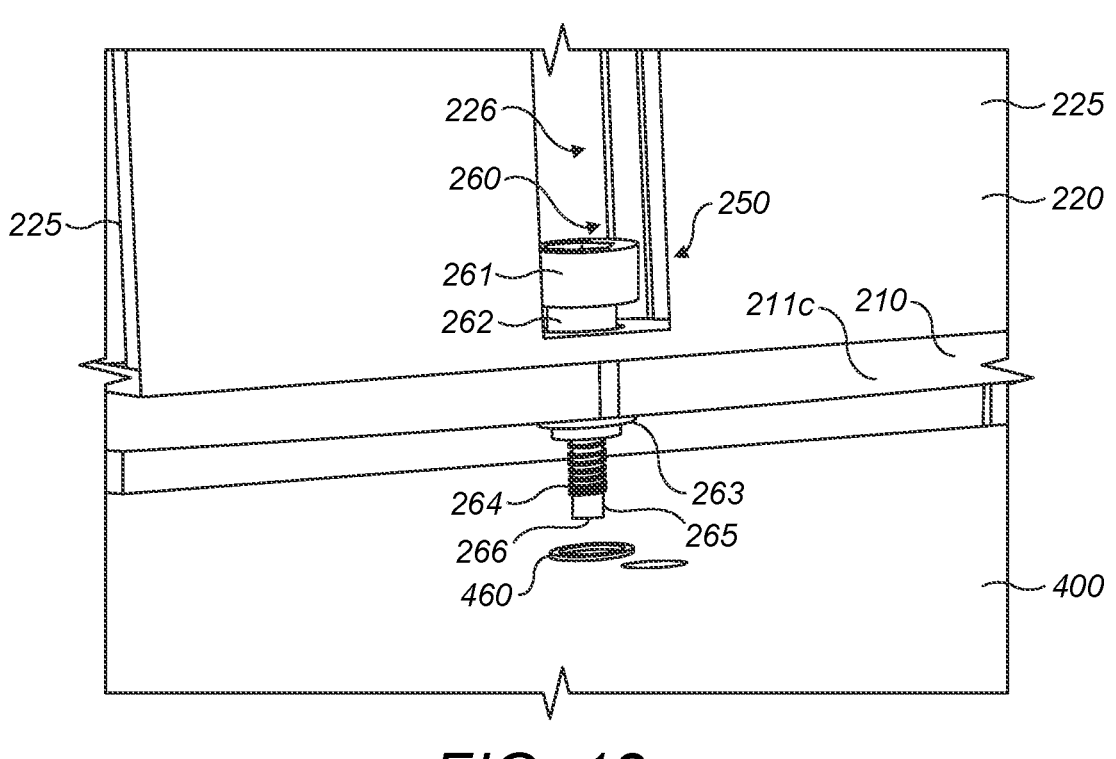
FIGS. 13a to 13e are views illustrating attachment and detachment of the example assembly of FIGS. 7 to 10 to a motherboard.

As shown in FIG. 13a, the fastener 260 is installed in the heatsink 200 so that the threadless body section 262 extends through the channel formed by the apertures 251 and 252. The head section 261 and the collar 263 are wider than the channel, so that once installed the fastener 260 is held captive in the channel. The body section 262 is longer than the channel, so that it can move vertically within the channel. However, the range of vertical motion of the fastener 260 is limited by the head 261 and collar 263. In one example, the portion of the threadless body section 262 between the head 261 and collar is 263 is 2 mm longer than the channel. The length difference between the channel and the threadless body section 262 defines the length of the first phase of attachment discussed below.

The fastener 260 may be installed in the channel formed by the apertures 251 and 252 after the upper heatsink component 220 and lower heatsink component 210 are assembled, for example by inserting a collarless fastener 260 into the channel and subsequently attaching the collar 263.

Engagement of the mounting system 250 with the motherboard 400 will now be discussed with particular reference to FIGS. 13a-e.

Figure 13B:
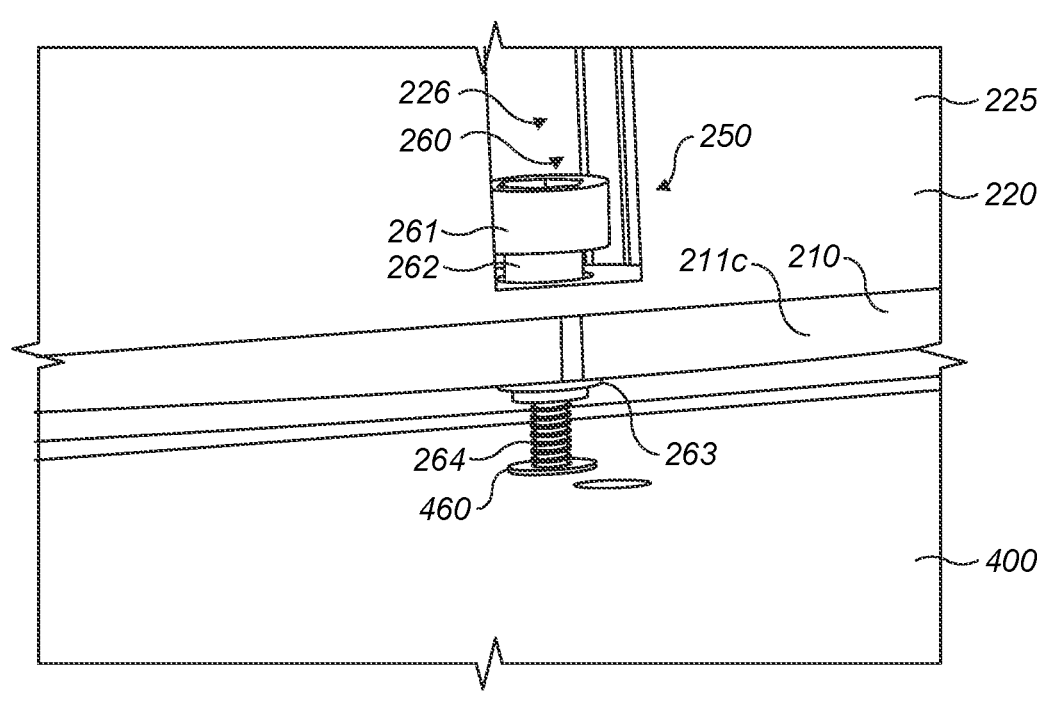

Firstly, as shown in FIGS. 13a and 13b, a user installing the assembly 300 uses the unthreaded locating projection 265 to locate the fastener 260 in the receiving section 460. The locating projection 265 acts as guide, allowing the fastener 260 to be partially received in the receiving section 460 before making a threaded connection. Locating projections 265 of both fasteners 260a, 260b may be located in their respective receiving sections, so that the assembly 300 is correctly aligned with the motherboard 400 and connection components 420 thereon before a threaded connection is made.

Figure 13C:
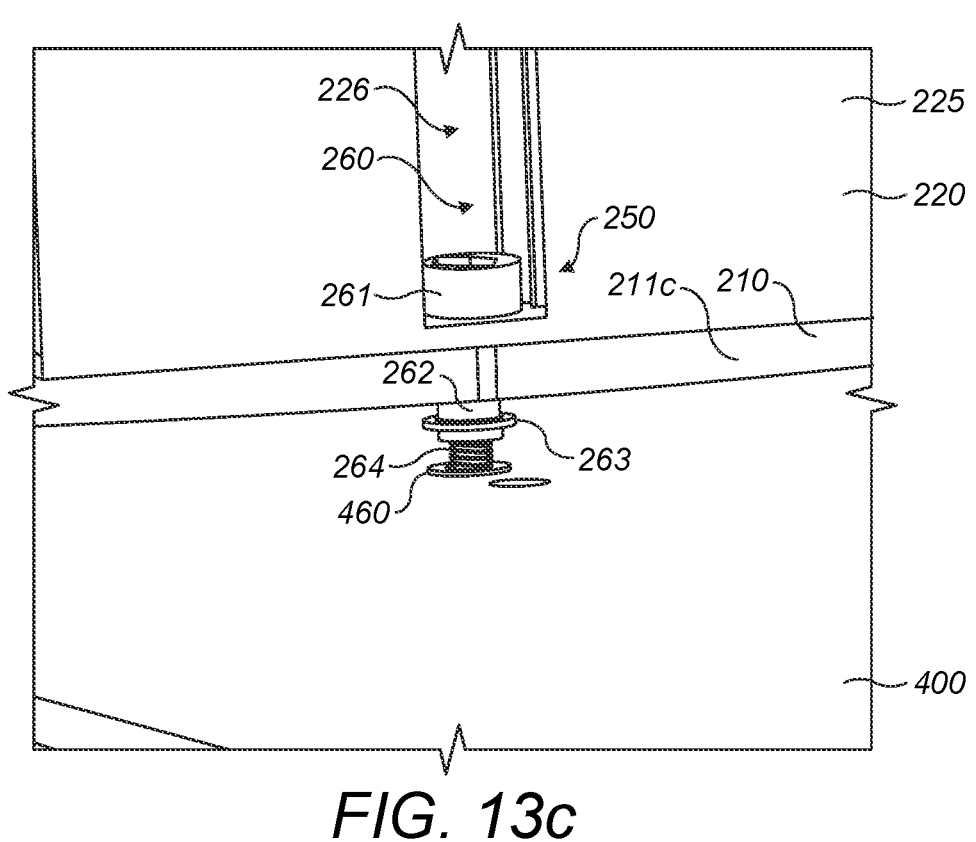
Figure 13D:
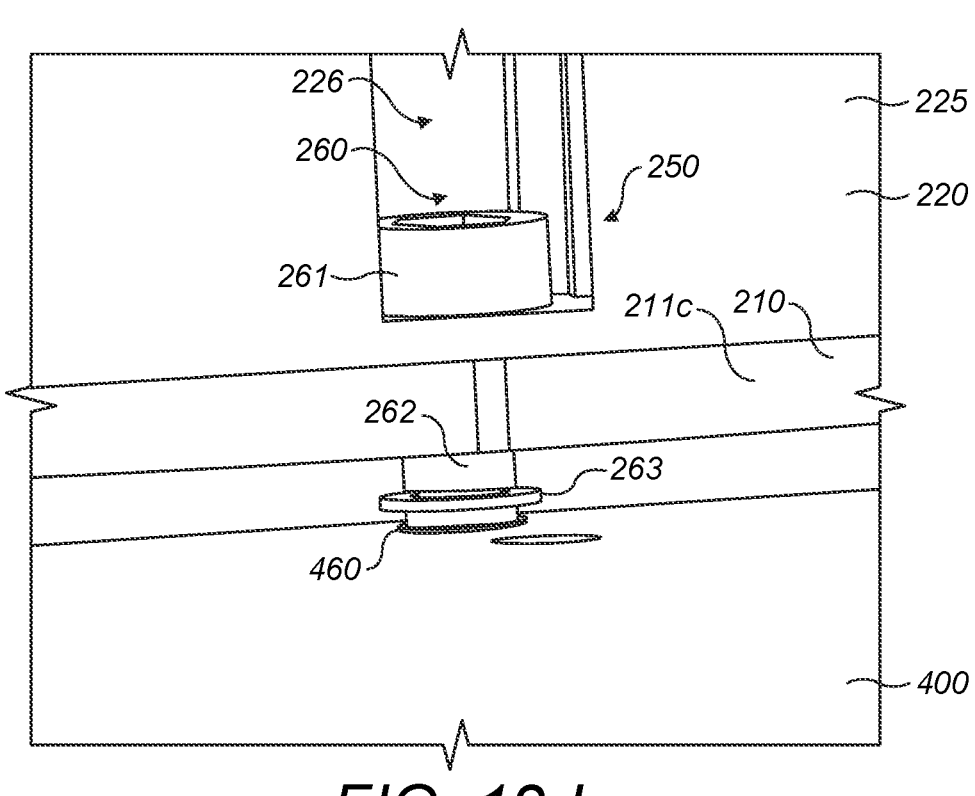

Next, as shown in FIG. 13c, a first phase of attachment commences in which the user advances the fastener 260 by rotating it to make a threaded connection with the receiving section 460. As the fastener 260 advances into the receiving section 460, the connection is made. Consequently, the unthreaded body section 262 descends through the channel. However, the descent of the fastener 260 in this phase of attachment does not cause the assembly 300 to be drawn towards the motherboard 400 to make the connection between the connection components 160a,b and connection components 420. This is because the head 261 of the fastener 260 is not engaged with the heatsink 200 in the area around the aperture 251a. As noted above, the length of this phase of attachment is defined by the length difference between the channel and the unthreaded body section 262. This may correspond to a particular number of turns of the fastener 260. The first phase of attachment ends when the head 261 of the fastener 260 engages the heatsink 200.

In one example, the user ceases the descent of one of the fasteners 260 at the end of the first phase of attachment (i.e. when the head 261 engages the heatsink 200), and carries out the corresponding process with the other fasteners 260. Accordingly, at the end of the first phase of attachment, the assembly 300 is physically attached to the motherboard 400, with the connection components 160 aligned with the corresponding connection components 420. However, the connection components 160 are not engaged with the corresponding connection components 420.

Finally, in a second phase of attachment, the fasteners 260 are further descended to engage the connection components 160 with the corresponding connection components 420. The second phase of attachment ends when the threaded section 264 is fully advanced into the receiving section, so that the bottom of the unthreaded body section 262, which may be referred to as the shoulder of the fastener 260, contacts the receiving section 460.

By providing the two phases of attachment, the assembly 300 is physically attached to the motherboard 400 and correctly aligned at the point at which the connection components 160,420 are connected. Furthermore, at the end of the first phase of attachment the possible range of motion of the assembly 300 with respect to the motherboard 400 is limited by the fasteners 260. Accordingly, the possibility of the major plane of the substrate 170 of the module 100 being placed at a sufficiently large angle with respect to the major plane of the motherboard 400 to cause damage to connectors 160, 420 is reduced. Furthermore, employing the first phase of attachment ensures that sufficient thread is engaged during the attachment process to secure the assembly 300 to the motherboard 400. That is to say, providing the two phases of engagement ensures the user drives the fasteners 260 sufficiently far into the receiving sections 460 to provide suitable engagement. In one example, the fastener 260 is sized so that the engaged thread is equal to or greater than the diameter of the fastener 260.

To remove the assembly 300 from the motherboard 400, one of the fasteners (e.g. fastener 260a) is rotated in the opposite direction, until its collar 263 contacts the underside of the lower heatsink component 210.

Figure 13E:
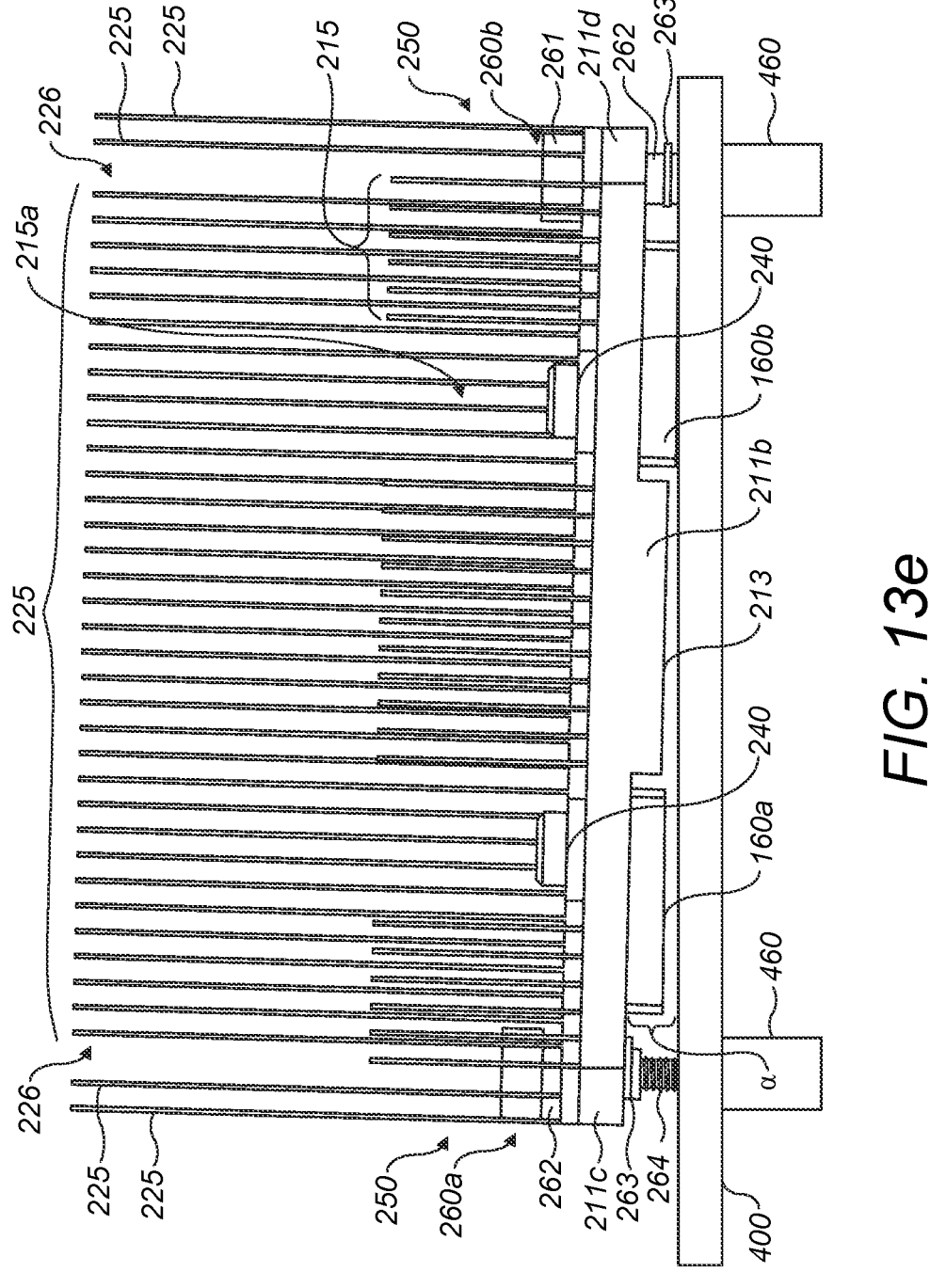

Subsequently, the fastener 260 can be rotated further until its threaded section 264 is fully removed from the bore of the receiving section. FIG. 13e illustrates the assembly 300 in this state, with the corresponding connection components 420 of the motherboard 400 omitted for clarity. During retraction of the fastener 260, the collar 263 acts on the underside of the peripheral edge 211c to raise the edge 211c and disengage the connection component 160a.

Accordingly, at the time that the collar 263 begins to act on the underside of peripheral edge 211c, only a portion of the thread 264 of the fastener remains engaged with the receiving section 460. This then limits the distance that the edge 211c can be raised to a distance corresponding to the length of the threaded portion 264 remaining engaged. Accordingly, the retraction of the thread cannot cause the side 211c to pivot with respect to side 211d beyond a safe angle α. In one example, the safe angle α is 1.3°.

Figure 15:
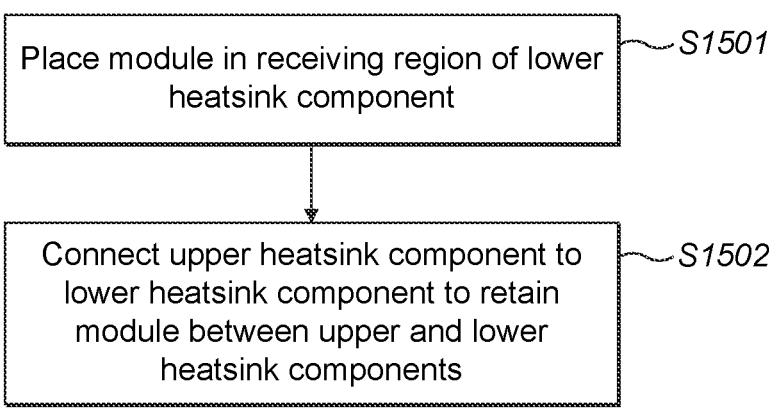
FIG. 15 is a schematic flowchart of an example method of assembling a memory and routing module with a heatsink.

FIG. 15 shows an example method of assembling a memory and routing module and a heatsink. The method comprises a step S1501 of placing the module in a module receiving region of a lower heatsink component, so that a thermally conductive portion of the lower heat sink component faces a plurality of semiconductor chips disposed on a lower side of the memory and routing module. The method comprises a step S1502 of connecting an upper heatsink component to the lower heatsink component to retain the memory and routing module between the upper heatsink component and lower heatsink component. The method may comprise further steps, as described herein.

Figure 16:
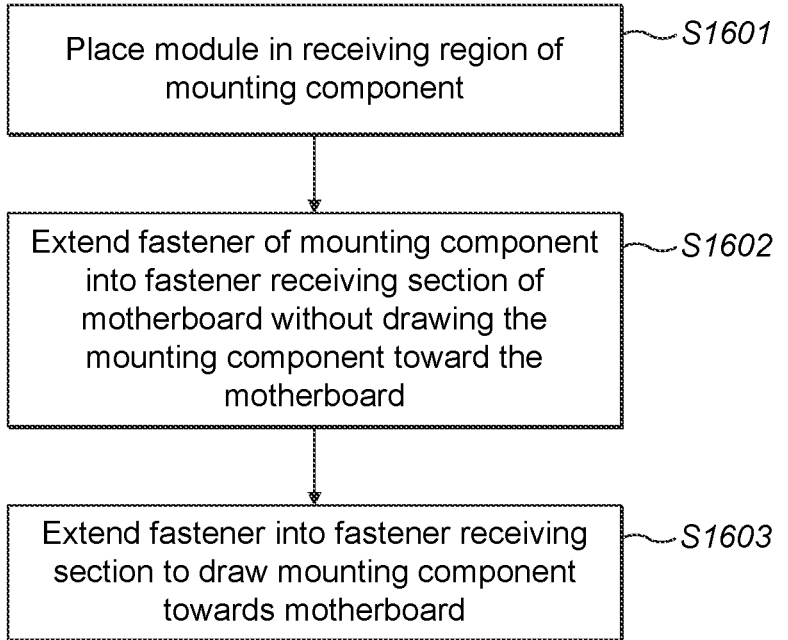
FIG. 16 is a schematic flowchart of an example method of mounting a memory and routing module to a motherboard.

FIG. 16 shows an example method of mounting a memory and routing module to a motherboard. The method comprises a step S1601 of placing the module in a module receiving region of a mounting component. The mounting component may for example be a heatsink that also acts to dissipate heat generated by the module. The method comprises a step S1602 of extending a fastener of the mounting component into a fastener receiving section of the motherboard without drawing the mounting component toward the motherboard. The method comprises a step S1603 of extending the fastener into the fastener receiving section to draw the mounting component towards the motherboard.

Various modifications may be made to the module 100 described above. In some examples, the number of fabric chips 140 and DRAMS 110 present in the module 100 may be varied from the examples discussed above. For example, each fabric chip 140 may be connected to fewer DRAMs 110 (i.e. 1, 2 or 3 DRAMs) or more DRAMs 110 (5 or more DRAMs, for example 8 DRAMs). In other examples, the module 100 may comprise fewer fabric chips 140 or more fabric chips 140. The module 100 may comprise fewer of the notional quadrants discussed above (e.g. 2 of the quadrants, 6 of the quadrants, 8 of the quadrants or any other suitable number). In some examples, the number of connection components 160 provided may also be varied. For example, only one connection component 160, or more than two connection components 160 may be provided. Furthermore, the elements of the fabric chip 140 may be varied.

Various modifications may also be made to the heatsink 200 described above. For example, the upper and lower heatsink components may be secured together by alternative means, including hinges, catches, latches and the like. Although the above examples include a single integral upper heatsink component and a single integral lower heatsink component, in other examples the upper and lower heatsink components may comprise multiple subcomponents coupled together. The size and shape of the heatsink may be varied to accommodate larger or smaller modules, or modules that have more or fewer connection components.

The mounting system may comprise more or fewer fasteners. Furthermore, the fasteners may have different configurations or designs that permit the above-described two-phase attachment. Furthermore, in some examples the mounting system may be disposed in a component that does not act as a heatsink. For example, a mounting component comprising a module receiving section but no fins or cross-member may be provided. In other examples, the mounting system may be disposed in the upper heatsink component or the lower heatsink component only. That is to say, the channel in which the fastener is disposed may be formed in the upper heatsink component only, the lower heatsink component only or both as discussed above.

Figure 8:
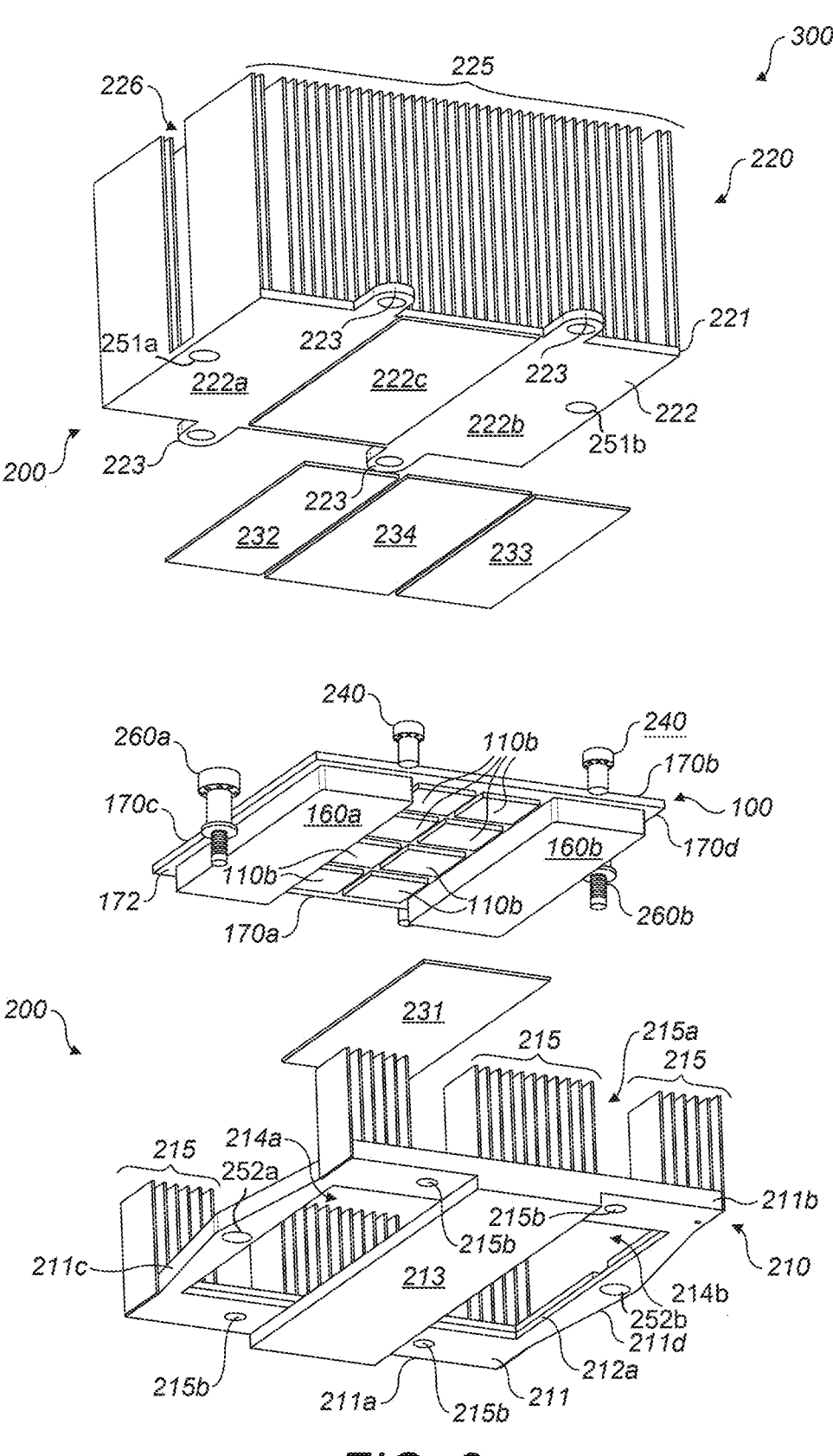
FIG. 8 is a lower exploded perspective view of the example assembly of FIG. 7.
Figure 9:
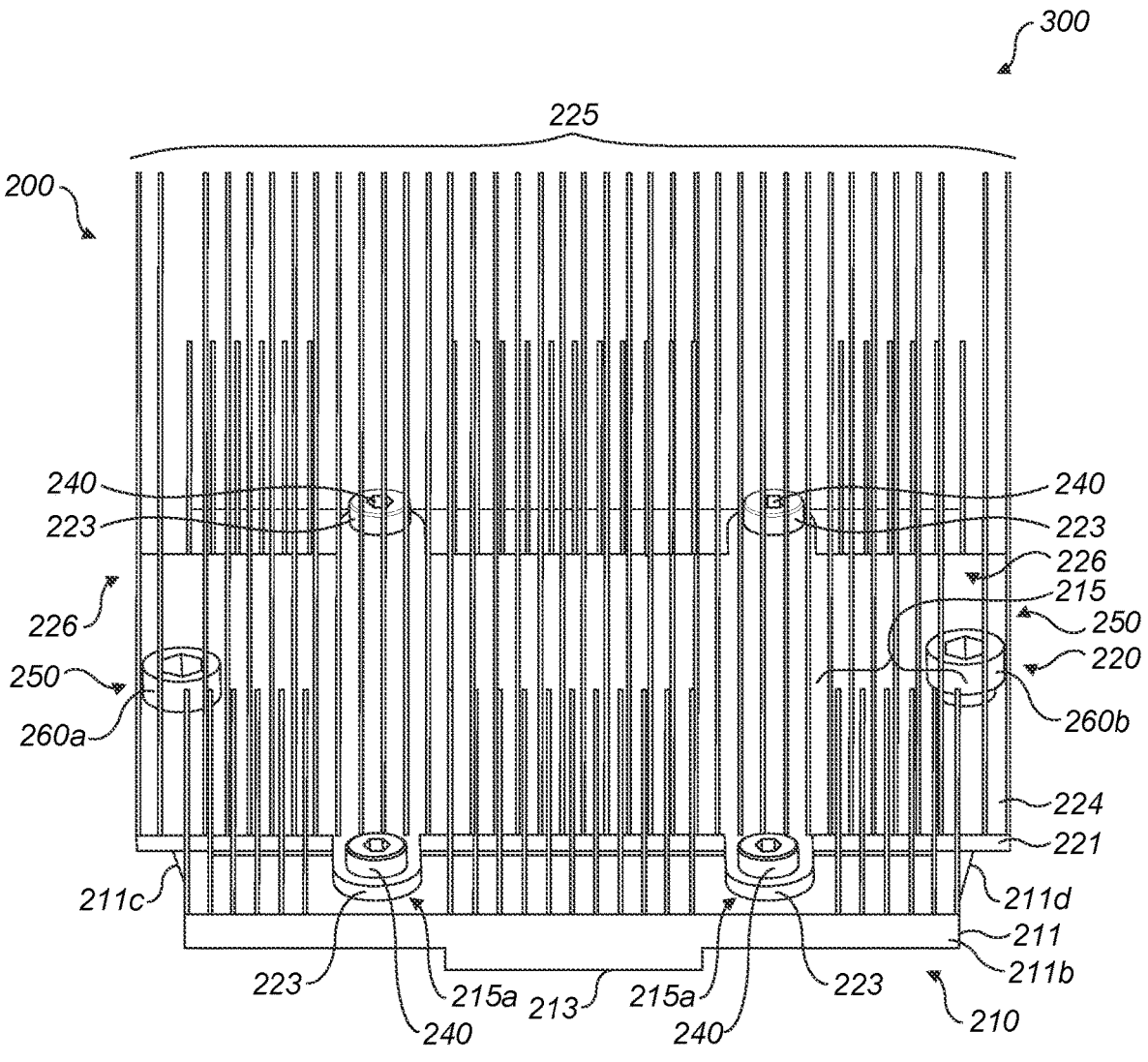
FIG. 9 is a perspective view of the example assembly of FIGS. 7 and 8 in an assembled configuration.

Advantageously, the module 100 provides routing functionality and a high-capacity, high-bandwidth and low-latency memory for a processor 20, rendering it suitable for the processing of large machine learning models. When arranged as shown in FIG. 8 with a ratio of two modules 100 to each processor 20, each processor has access to 512 GB at an example bandwidth of 9.6 Tbit/s. Furthermore, the use of module 100 limits the links required on the processor 20, saving valuable beach front space that would ordinarily be used for memory access and routing.

Advantageously, the module 100 comprises directly flip-chip attached fabric chips 140 and DRAMs 110 and connection components 160 attached to the module 100 via BGAs. By permitting direct flip-chip attachment of the fabric chips 140 to the substrate, the fabric chips 140 do not require additional packaging, and thus the overall size of the module 100 can be reduced.

Furthermore, the above-described heatsink provides a means of conducting heat generated by chips disposed on the underside of the module to dissipate it, thereby preventing damaged caused by overheating. The mounting system advantageously ensures alignment of the connection components during connection and disconnection of the assembly from the motherboard and may prevent too large an angle developing between the plane of the module and the plane of the motherboard. In addition, the heatsink may support the module during connection and disconnection. Accordingly, damage to the connection components or the module more generally may be avoided.

The invention claimed is:

1. A heatsink for a memory and routing module, the memory and routing module having a lower side and an upper side, the lower side having a first plurality of semiconductor chips attached thereto and the upper side having a second plurality of semiconductor chips attached thereto, the lower side further having a first connection component disposed thereon, the memory and routing module configured for electrical connection to a motherboard, the heatsink comprising:

a lower heatsink component comprising:
a module receiving region configured to receive the lower side of the memory and routing module and comprising:
a first thermally conductive portion arranged to face the first plurality of semiconductor chips;
a first aperture through the lower heatsink component configured to permit the first connection component disposed on the lower side of the memory and routing module to connect to a corresponding second connection component disposed on the motherboard;
a thermally conductive peripheral region disposed around the module receiving region, the peripheral region connected to the first thermally conductive portion and comprising a plurality of first heat dissipating elements configured to dissipate heat conducted from the first plurality of semiconductor chips;
an upper heatsink component, the upper heatsink component configured to connect to the lower heatsink component at the peripheral region so as to retain the memory and routing module between the upper heatsink component and the lower heatsink component, the upper heatsink component comprising:
a first side comprising a second thermally conductive portion arranged to face the second plurality of semiconductor chips;
a plurality of second heat dissipating elements connected to the second thermally conductive portion and configured to dissipate heat conducted from the first plurality of semiconductor chips.

2. The heatsink of claim 1, wherein:
the lower heatsink component comprises a second aperture in addition to the first aperture, wherein the first aperture and the second aperture are configured to permit the first connection component and a third connection component to connect to the corresponding second connection component and a corresponding fourth connection component on the motherboard; and
the first thermally conductive portion is arranged between the first aperture and the second aperture to face the first plurality of semiconductor chips.

3. The heatsink of claim 1, wherein the first thermally conductive portion comprises thermal interface material configured to provide conformant thermal conduction across the first plurality of semiconductor chips.

4. The heatsink of claim 1, wherein the second thermally conductive portion comprises thermal interface material configured to provide conformant thermal conduction across the second plurality of semiconductor chips.

5. The heatsink of claim 1, wherein the module receiving region comprises a recess corresponding in size to a substrate of the memory and routing module.

6. The heatsink of claim 1, wherein the first heat dissipating elements and the second heat dissipating elements comprise fins.

7. The heatsink of claim 1, wherein the upper heatsink component and the lower heatsink component are configured to clamp the memory and routing module.

8. The heatsink of claim 1, further comprising:

a plurality of lugs extending from the upper heatsink component;

a plurality of bores formed in the peripheral region of the lower heatsink component; and a plurality of connecting fasteners configured to extend through the lugs and into the bores to connect the upper heatsink component to the lower heatsink component, wherein the lugs are configured to deform towards the lower heatsink component during connection.

9. The heatsink of claim 1, wherein the lower heatsink component and the upper heatsink component are formed of aluminum.

10. The heatsink of claim 1, wherein the heatsink is a passive heatsink comprising a plurality of heat dissipating fins.

11. The heatsink of claim 1, further comprising:

a fastener receivable in a fastener receiving section of the motherboard;

wherein the fastener is configured for:

a first phase of attachment in which the fastener is extended into the fastener receiving section without drawing the heatsink towards the motherboard; and a second phase of attachment in which the fastener draws the heatsink towards the motherboard.

12. The heatsink of claim 11, wherein:

the fastener comprises an unthreaded body portion retained in a channel formed in the heatsink, the unthreaded body portion being longer than the channel, and a threaded portion configured to be received in a threaded bore of the fastener receiving section;

wherein the unthreaded body portion is configured to travel through the channel in the first phase of attachment.

13. The heatsink of claim 1, further comprising a first fastener disposed at one side of the heatsink and a second fastener disposed at an opposing side of the heatsink.

14. The heatsink of claim 13, wherein:

the first fastener and the second fastener are disposed in a middle of their respective sides of the heatsink, and the respective sides are substantially parallel with a long edge of a respective connection component.

15. A method of assembling a memory and routing module and a heatsink, the method comprising:

placing the memory and routing module in a module receiving region of a lower heatsink component, so that a thermally conductive portion of the lower heatsink component faces a plurality of semiconductor chips disposed on a lower side of the memory and routing module; and connecting an upper heatsink component to the lower heatsink component to retain the memory and routing module between the upper heatsink component and the lower heatsink component, wherein the lower heatsink component comprises an aperture and the memory and routing module comprises a first connection component disposed on the lower side of the memory and routing module, and wherein connecting the upper heatsink component to the lower heatsink component comprises disposing the first connection component so that it is permitted to connect to a corresponding second connection component disposed on a motherboard via the aperture.

16. A mounting component comprising:

a module receiving region configured to receive a memory and routing module, an aperture through the mounting component configured to permit a first connection component disposed on the memory and routing module to connect to a second connection component disposed on a motherboard; and a first fastener receivable in a fastener receiving section of the motherboard, wherein the first fastener is configured for:

a first phase of attachment in which the first fastener is extended into the fastener receiving section without drawing the mounting component towards the motherboard; and a second phase of attachment in which the first fastener draws the mounting component towards the motherboard.

17. The mounting component of claim 16, wherein:

the first fastener comprises an unthreaded body portion retained in a channel formed in the mounting component, the unthreaded body portion being longer than the channel, and a threaded portion configured to be received in a threaded bore of the fastener receiving section;

wherein the first fastener is configured to descend through the channel in the first phase of attachment.

18. The mounting component of claim 16, wherein the first fastener is disposed at one side of a heatsink and a second fastener is disposed at an opposing side of the mounting component.

19. The mounting component of claim 18, wherein:

the first fastener and the second fastener are disposed in a middle of their respective sides of the mounting component, and the respective sides are substantially parallel with a long edge of a respective connection component.

* * * * *